US012441965B2

(12) United States Patent
Sugishima et al.

(10) Patent No.: US 12,441,965 B2
(45) Date of Patent: Oct. 14, 2025

(54) TREATMENT LIQUID AND SUBSTRATE WASHING METHOD

(71) Applicant: FUJIFILM Corporation, Tokyo (JP)

(72) Inventors: Yasuo Sugishima, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 481 days.

(21) Appl. No.: 18/158,544

(22) Filed: Jan. 24, 2023

(65) Prior Publication Data

US 2023/0212485 A1 Jul. 6, 2023

Related U.S. Application Data

(63) Continuation of application No. PCT/JP2021/023966, filed on Jun. 24, 2021.

(30) Foreign Application Priority Data

Jul. 30, 2020 (JP) ................................ 2020-128876
Feb. 22, 2021 (JP) ................................ 2021-026410

(51) Int. Cl.
*C11D 3/26* (2006.01)
*C11D 3/18* (2006.01)
(Continued)

(52) U.S. Cl.
CPC ............ *C11D 7/5022* (2013.01); *C11D 3/184* (2013.01); *C11D 3/2044* (2013.01); *C11D 3/30* (2013.01);
(Continued)

(58) Field of Classification Search
CPC ......... C11D 3/184; C11D 3/2044; C11D 3/30; C11D 7/244; C11D 7/3209; C11D 7/50; C11D 7/5022
(Continued)

(56) References Cited

U.S. PATENT DOCUMENTS 8,236,485 B2 * 8/2012 Minsek .................... C11D 7/50 510/176
2014/0109931 A1 4/2014 Lee et al.
(Continued)

FOREIGN PATENT DOCUMENTS

JP 2008-45119 A 2/2006
JP 2018-164091 A 10/2018
WO 2017/208767 A1 12/2017

OTHER PUBLICATIONS

International Preliminary Report on Patentability dated Jan. 31, 2023 with a Translation of the Written Opinion of the International Searching Authority in Application No. PCT/JP2021/023966.
(Continued)

*Primary Examiner* — Gregory R Delcotto
(74) *Attorney, Agent, or Firm* — Sughrue Mion, PLLC

(57) ABSTRACT

An object of the present invention is to provide a treatment liquid for a semiconductor device, which is excellent in removal performance for residues present on a substrate, and to provide a substrate washing method using the treatment liquid.

The treatment liquid of the present invention is a treatment liquid for a semiconductor device, which includes water, a basic compound, hexylene glycol, and a compound A that is at least one kind selected from the group consisting of isobutene, (E)-2-methyl-1,3-pentadiene, 4-methyl-1,3-pentadiene, 2,2,4-trimethyloxetane, 4-methyl-3-penten-2-ol, and 2,4,4,6-tetramethyl-1,3-dioxane.

20 Claims, 1 Drawing Sheet

(51) Int. Cl.

| | |
|---|---|
| ***C11D 3/20*** | (2006.01) |
| ***C11D 3/30*** | (2006.01) |
| ***C11D 3/32*** | (2006.01) |
| ***C11D 7/24*** | (2006.01) |
| ***C11D 7/26*** | (2006.01) |
| ***C11D 7/32*** | (2006.01) |
| ***C11D 7/50*** | (2006.01) |
| ***H01L 21/02*** | (2006.01) |

(52) U.S. Cl.

CPC .............. *C11D 7/244* (2013.01); *C11D 7/261* (2013.01); *C11D 7/267* (2013.01); *C11D 7/3209* (2013.01); *C11D 7/3218* (2013.01); *C11D 7/50* (2013.01); *H01L 21/02057* (2013.01); *C11D 2111/22* (2024.01)

(58) Field of Classification Search

USPC ......................... 510/175, 176, 499, 505, 506

See application file for complete search history.

(56) References Cited

U.S. PATENT DOCUMENTS

| | | | | |
|---|---|---|---|---|
| 2016/0186106 | A1* | 6/2016 | Du ........................ | C11D 7/5009<br>510/176 |
| 2019/0062674 | A1* | 2/2019 | Dory .................... | C11D 7/5004 |
| 2019/0079409 | A1 | 3/2019 | Takahashi et al. | |

OTHER PUBLICATIONS

International Search Report dated Sep. 7, 2021 in Application No. PCT/JP2021/023966.

Written Opinion of the International Searching Authority dated Sep. 7, 2021 in Application No. PCT/JP2021/023966.

Communication dated Nov. 28, 2023 issued by the Japanese Patent Office in application No. 2022-540073.

* cited by examiner

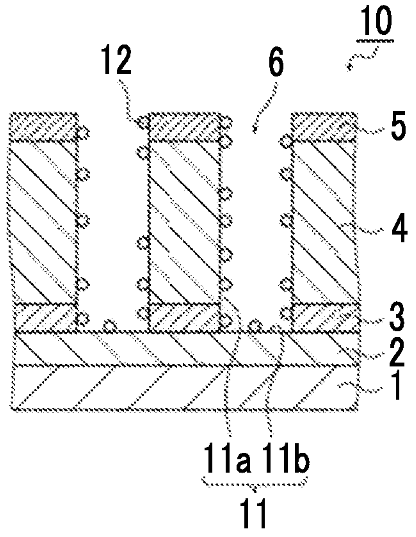
10
12
6
5
4
3
2
1
11a
11b
11

TREATMENT LIQUID AND SUBSTRATE WASHING METHOD

CROSS-REFERENCE TO RELATED APPLICATIONS

This application is a Continuation of PCT International Application No. PCT/JP2021/023966 filed on Jun. 24, 2021, which claims priority under 35 U.S.C. § 119(a) to Japanese Patent Application No. 2020-128876 filed on Jul. 30, 2020 and Japanese Patent Application No. 2021-026410 filed on Feb. 22, 2021. The above applications are hereby expressly incorporated by reference, in its entirety, into the present application.

BACKGROUND OF THE INVENTION

1. Field of the Invention

The present invention relates to a treatment liquid and a substrate washing method.

2. Description of the Related Art

Semiconductor devices such as charge-coupled devices (CCD) and memories are manufactured by forming fine electronic circuit patterns on a substrate, using photolithography technology. The semiconductor devices are manufactured, for example, by disposing a laminate having a metal layer serving as a wiring line material, an etching stop film, and an interlayer insulating film on a substrate, forming a resist film on this laminate, and carrying out a photolithography step and a dry etching step (for example, a plasma etching treatment).

Specifically, in the photolithography step, the metal layer and/or the interlayer insulating film on the substrate is etched by a dry etching treatment using the obtained resist film as a mask.

In this case, residues derived from the metal layer and/or the interlayer insulating film and the like may adhere to the substrate, the metal layer, and/or the interlayer insulating film. In order to remove the adhered residues, washing using a treatment liquid is often carried out.

In addition, the resist film used as a mask during etching is then removed from the laminate by a dry-type method (dry ashing) by ashing (incineration), a wet-type method, or the like. The residues derived from the resist film or the like may adhere to the laminate from which the resist has been removed by using the dry ashing method. In order to remove the adhered residues, washing using a treatment liquid is often carried out. On the other hand, examples of the aspect of the wet-type method for removing the resist film include an aspect of removing the resist film using a treatment liquid.

As described above, the treatment liquid is used for removing residues (etching residues and ashing residues) and/or a resist film in the semiconductor device manufacturing step.

For example, JP2018-164091A discloses a composition for removing residues from a semiconductor base material, which contains water, a water-miscible organic solvent other than ether, an amine compound selected from the group consisting of an alkanol amine and aminopropyl morpholine, an organic acid, and a fluoride ion supply source, each of which is contained at a specific content.

SUMMARY OF THE INVENTION

As a result of studying a treatment liquid for a semiconductor substrate with reference to JP2018-164091A, the inventors of the present invention revealed that regarding the treatment liquid containing hexylene glycol as an organic solvent, there is room for further improvement in the removal performance for residues present on the substrate.

Therefore, an object of the present invention is to provide a treatment liquid for a semiconductor device, which is excellent in removal performance for residues present on a substrate.

In addition, an object of the present invention is to provide a substrate washing method using the treatment liquid.

As a result of diligent studies to solve the above problems, the inventors of the present invention found that the above problems can be solved in a case where a treatment liquid contains hexylene glycol and a specific organic compound, thereby completing the present invention.

That is, the inventors of the present invention found that the above-described problems can be solved by the following configurations.

[1]A treatment liquid for a semiconductor device, comprising:

water;

a basic compound;

hexylene glycol; and a compound A that is at least one kind selected from the group consisting of isobutene, (E)-2-methyl-1,3-pentadiene, 4-methyl-1,3-pentadiene, 2,2,4-trimethyloxetane, 4-methyl-3-penten-2-ol, and 2,4,4,6-tetramethyl-1,3-dioxane.

[2] The treatment liquid according to [1], in which in a case where the treatment liquid contains one kind of the compound A, a content of the compound A with respect to a total mass of the treatment liquid is 1,000 ppm by mass or less, and in a case where the treatment liquid contains two or more kinds of the compounds A, a content of each of the compounds A with respect to the total mass of the treatment liquid is 1,000 ppm by mass or less.

[3] The treatment liquid according to [1] or [2], in which the treatment liquid contains two or more kinds of the compounds A, and in the treatment liquid, in a case where a content of a compound having a highest content among the compounds A is denoted by $\alpha$ and a content of a compound having a second highest content among the compounds A is denoted by $\beta$, a ratio $\alpha/\beta$ of the content $\alpha$ to the content $\beta$ is less than 10 in terms of mass ratio.

[4] The treatment liquid according to any one of [1] to [3], in which the treatment liquid contains three or more kinds of the compounds A, and in the treatment liquid, in a case where a content of a compound having a second highest content among the compounds A is denoted by $\beta$ and a content of a compound having a third highest content among the compounds A is denoted by $\gamma$, a ratio $\beta/\gamma$ of the content $\beta$ to the content $\gamma$ is less than 10 in terms of mass ratio.

[5] The treatment liquid according to any one of [1] to [4], in which the treatment liquid contains at least one kind selected from the group consisting of isobutene, 4-methyl-1,3-pentadiene, 2,2,4-trimethyloxetane, and 4-methyl-3-penten-2-ol.

[6] The treatment liquid according to any one of [1] to [5], in which a content of the hexylene glycol in the treatment liquid is 60% by mass or more with respect to a total mass of the treatment liquid.

[7] The treatment liquid according to any one of [1] to [6], in which the basic compound includes at least one selected from the group consisting of tetramethylammonium hydroxide, monoethanolamine, and hydroxylamine.

[8] The treatment liquid according to any one of [1] to [7], in which the basic compound includes a compound B represented by Formula (1) described later.

[9] The treatment liquid according to [8], in which the compound B includes at least one selected from the group consisting of 2-(2-aminoethylamino)ethanol, 2,2'-oxybis (ethylamine), and 2-(2-aminoethoxy)ethanol.

[10] The treatment liquid according to [8] or [9], in which a content of the compound B with respect to a total mass of the treatment liquid is 0.1% to 1.15% by mass.

[11] The treatment liquid according to any one of [1] to [10], in which the basic compound includes two or more kinds of amine compounds.

[12] The treatment liquid according to [11], in which in the treatment liquid, a ratio of a content of a compound having a highest content among the amine compounds to a content of an amine compound having a lowest content among the amine compounds is 9 to 100 in terms of mass ratio.

[13] The treatment liquid according to any one of [1] to [12], in which the treatment liquid is used as a washing solution for removing etching residues from a substrate including a metal-containing layer or as a washing solution for removing residues from a substrate after chemical mechanical polishing.

[14]A substrate washing method comprising a washing step of washing a substrate including a metal-containing layer, by using the treatment liquid according to any one of [1] to [13].

According to the present invention, it is possible to provide a treatment liquid for a semiconductor device, which is excellent in removal performance for residues present on a substrate.

In addition, according to the present invention, it is possible to provide a substrate washing method using the treatment liquid.

BRIEF DESCRIPTION OF THE DRAWINGS

FIG. 1 is a schematic cross-sectional view illustrating an example of a laminate which is an object to be washed in a substrate washing method.

DESCRIPTION OF THE PREFERRED EMBODIMENTS

Hereinafter, the present invention will be described in detail.

Descriptions of the configuration requirements which will be described later are made based on representative embodiments of the present invention in some cases, but it should not be construed that the present invention is limited to such embodiments.

In the present specification, the numerical value range indicated by using "to" means a range including the numerical values before and after "to" as the lower limit value and the upper limit value, respectively.

In addition, in the present specification, the "preparation" is meant to include supplying a predetermined material by purchases or the like, in addition to providing specific materials by synthesis, combination, or the like.

In the present specification, in a case where two or more kinds of a certain component are present, the "content" of the component means a total content of the two or more kinds of the component unless otherwise specified.

In addition, in the present specification, "ppm" means "parts-per-million ($10^{-6}$)", and "ppb" means "parts-per-billion ($10^{-9}$)" and "ppt" means "parts-per-trillion ($10^{-12}$)".

In addition, in the present specification, 1 Å (angstrom) corresponds to 0.1 nm.

In addition, the present specification, in a case where there is no description regarding whether a group (atomic group) is substituted or unsubstituted, as long as the effects of the present specification are not reduced, the group includes both the group having no substituent and the group having a substituent. For example, the "hydrocarbon group" refers to not only a hydrocarbon group not having a substituent (unsubstituted hydrocarbon group) but also a hydrocarbon group having a substituent (substituted hydrocarbon group). This also applies to each compound.

In addition, the "radiation" in the present specification means, for example, a bright line spectrum of a mercury lamp, far ultraviolet rays typified by an excimer laser, extreme ultraviolet rays (EUV rays), X-rays, or electron beams. In addition, in the present specification, light means actinic rays or radiation. Unless otherwise specified, the "exposure" in the present specification includes not only exposure with a mercury lamp, far ultraviolet rays represented by an excimer laser, X-rays, or EUV rays, but also the exposure includes drawing with particle beams such as electron beams and ion beams.

[Treatment Liquid]

The treatment liquid according to the embodiment of the present invention (hereinafter, also referred to as "the present treatment liquid") contains at least water, a basic compound, hexylene glycol, and a specific compound A.

The mechanism by which the above-described problems are solved by the present treatment liquid having such a configuration is not necessarily clear; however, the inventors of the present invention conceive as follows.

That is, it is presumed that the present treatment liquid has an action of removing residues present on a substrate while suppressing the corrosion of the metal layer due to containing hexylene glycol which is soluble in water and has low reactivity with a metal and a basic compound which has a function of removing residues, and thus the present treatment liquid further promotes the dissolution of the slightly hydrophobic residues due to further containing a specific compound A having compatibility with hexylene glycol, which contributes to the efficiency of the removal of the entire residues.

Hereinafter, the fact that the treatment liquid is more excellent in the removal performance (residue removability) for residues present on the substrate is also described as "the effect of the present invention is more excellent".

[Component]

Hereinafter, components contained in the treatment liquid according to the embodiment of the present invention will be described in detail.

<Water>

The present treatment liquid contains water.

The content of water is not particularly limited; however, it is, for example, 0.01% to 40% by mass, preferably 0.1% to 20% by mass, and more preferably 1% to 10% by mass, with respect to the total mass of the treatment liquid.

The water is preferably ultrapure water that is used for manufacturing a semiconductor device.

In particular, the water is preferably water in which inorganic anions, metal ions, and the like are reduced. Among the above, it is more preferably water in which the concentration of ions derived from metals of Fe, Co, Na, K, Ca, Cu, Mg, Mn, Li, Al, Cr, Ni, and Zn is reduced, and it is still more preferably water in which the above concentration thereof is adjusted to be on the order of ppt or less (in one form, the metal content is less than 0.001 ppt by mass) at the time when used in the preparation of the treatment liquid. The method of carrying out the adjustment is preferably, purification using a filtration membrane or an ion-exchange membrane or purification by distillation. Examples of the method of carrying out the adjustment include the method described in paragraphs [0074] to [0084] of JP2011-110515A and the method described in JP2007-254168A.

The water that is used in the embodiment of the present invention is preferably the water obtained as described above. In addition, from the viewpoint that the desired effect of the present invention can be remarkably obtained, it is more preferable that the above-described water is used not only for the treatment liquid but also for washing a storage container. Further, it is preferable that the above-described water is also used in the manufacturing step of the treatment liquid, the measurement of components of the treatment liquid, the measurement for evaluation of the treatment liquid, and the like.

<Basic Compound>

The treatment liquid contains a basic compound. The basic compound is intended to be a compound, where the pH of a solution of the compound exceeds 7 in a case of being dissolved in water. The basic compound has a function of removing residues such as an etching residue and an ashing residue. In addition, the basic compound also has a function as a pH adjusting agent for adjusting the pH of the treatment liquid.

The basic compound is not particularly limited, and examples thereof include ammonium hydroxide, an amine compound, and a quaternary ammonium compound.

Hereinafter, the ammonium hydroxide compound, the amine compound, and the quaternary ammonium compound will be described in detail.

(Ammonium Hydroxide)

The treatment liquid may contain ammonium hydroxide ($NH_4OH$) as the basic compound.

In a case where the treatment liquid contains ammonium hydroxide, the content of the ammonium hydroxide is not particularly limited; however, it is preferably 0.01% to 10% by mass, and more preferably 0.05% to 5.0% by mass with respect to the total mass of the treatment liquid.

(Amine Compound)

In the present specification, the amine compound is intended to be a compound having an amino group in the molecule.

Examples of the amine compound include a primary amine having a primary amino group ($-NH_2$) in the molecule, a secondary amine having a secondary amino group (>NH) in the molecule, a tertiary amine having a tertiary amino group (>N—) in the molecule, and a salt thereof. It is noted that the compound contained in a corrosion inhibitor described below is not included in the basic compound.

Examples of the salt of the amine compound include a salt of an inorganic acid, in which at least one non-metal selected from the group consisting of Cl, S, N, and P is bonded to hydrogen, where a hydrochloride, a sulfate, or a nitrate is preferable.

In addition, the amine compound is preferably a water-soluble amine, where an amount of 50 g or more of the amine compound can be dissolved in 1 L of water.

Examples of the amine compound include an alicyclic amine compound, an alkanol amine, a hydroxylamine compound, and another amine compound other than these compounds.

The alicyclic amine compound is intended to be a compound having a ring structure in the molecule among the amine compounds.

Examples of the alicyclic amine compound include 1,8-diazabicyclo[5.4.0]-7-undecene (DBU), ε-caprolactam, the following compound 1, the following compound 2, the following compound 3, 1,4-diazabicyclo[2.2.2]octane (DABCO), tetrahydrofurfurylamine, N-(2-aminoethyl)piperazine, hydroxyethylpiperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4,3,0]-5-nonene.

Compound 1

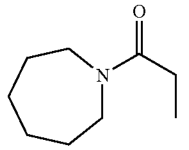

Compound 2

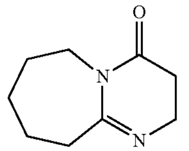

Compound 3

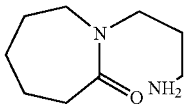

The alkanol amine is intended to be an amine compound having at least one hydroxyalkyl group in the molecule. The alkanol amine may have any one of a primary amino group, a secondary amino group, or a tertiary amino group; however, it preferably has a primary amino group.

Examples of the alkanol amine include monoethanolamine (MEA), diethanolamine (DEA), triethanolamine (TEA), diethylene glycolamine (DEGA), trishydroxymethylaminomethane (Tris), and 2-amino-2-methyl-1-propanol (AMP), 2-amino-2-methyl-1,3-dipropanol (AMPD), 2-amino-2-ethyl-1,3-dipropanol (AEPD), 2-(methylamino)-2-methyl-1-propanol (N-MAMP), 2-(aminoethoxy)ethanol (AEE), N-(2-aminoethyl)ethanolamine (AEEA), and 2,2'-oxybis(ethylamine), where AEE, AEEA, or 2,2'-oxybis(ethylamine) is preferable.

The hydroxylamine compound is at least one compound selected from the group consisting of hydroxylamine ($NH_2OH$), a hydroxylamine derivative, and a salt thereof.

The hydroxylamine compound has a function of promoting decomposition and solubilization of residues and removing residues such as an etching residue and an ashing residue.

The hydroxylamine derivative is not particularly limited; however, examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

Examples of the salts of the hydroxylamine and the hydroxylamine derivative include inorganic acid salts and organic acid salts, where an inorganic acid salt formed by bonding a non-metal atom such as Cl, S, N, or P to a hydrogen atom is preferable, and a salt of any acid of hydrochloric acid, sulfuric acid, or nitric acid is more preferable.

The inorganic acid salts of the hydroxylamine and the hydroxylamine derivative are preferably hydroxylamine nitrate, hydroxylamine sulfate, hydroxylamine hydrochloride, hydroxylamine phosphate, N,N-diethylhydroxylamine sulfate, N,N-diethylhydroxylamine nitrate, or a mixture thereof.

In addition, examples of the organic acid salts of the hydroxylamine and the hydroxylamine derivative include a hydroxylammonium citrate, a hydroxylammonium oxalate, and a hydroxylammonium fluoride.

The hydroxylamine compound is preferably hydroxylamine from the viewpoint that the effect of the present invention is more excellent.

One kind of the hydroxylamine compound may be used alone, or two or more kinds thereof may be used in combination.

In a case where the treatment liquid contains a hydroxylamine compound, the content of the hydroxylamine compound is not particularly limited; however, it is preferably 0.01% to 30% by mass and more preferably 0.5% to 25% by mass with respect to the total mass of the treatment liquid.

Among the amine compounds, examples of the primary amine other than the alicyclic amine compound, the alkanol amine, and the hydroxylamine compound include methylamine, ethylamine, ethylenediamine, propylamine, butylamine, pentylamine, methoxyethylamine, and methoxypropylamine.

Examples of the secondary amine other than the alicyclic amine compound, the alkanol amine, and the hydroxylamine compound include dimethylamine, diethylamine, dipropylamine, and dibutylamine (DBA).

Examples of the tertiary amine other than the alicyclic amine compound, the alkanol amine, and the hydroxylamine compound include trimethylamine, triethylamine, and tributylamine (TBA).

Examples of the preferred amine compound include a compound B represented by Formula (1) below.

$$NH_2—CH_2CH_2—X—CH_2CH_2—Y \quad (1)$$

In Formula (1), X represents —NR— or —O—, where R represents a hydrogen atom or a substituent, and Y represents a hydroxy group (—OH) or a primary amino group ($—NH_2$).

Examples of the substituent represented by R include a substituted or unsubstituted hydrocarbon group, where a substituted or unsubstituted alkyl group is preferable. The above-described hydrocarbon group and alkyl group may be either linear, branched, or cyclic. The above-described hydrocarbon group and alkyl group have, for example, 1 to 6 carbon atoms, preferably 1 to 3 carbon atoms, and more preferably 1 or 2 carbon atoms. Examples of the substituent which may be contained in the above-described hydrocarbon group and alkyl group include a hydroxy group and a primary amino group.

R is preferably a hydrogen atom or an alkyl group having 1 to 3 carbon atoms, which may have a hydroxy group or a primary amino group, more preferably a hydrogen atom or an ethyl group which may have a hydroxy group or a primary amino group, and still more preferably a hydrogen atom.

The number of amino groups contained in the compound B is, for example, 1 to 5, and it is preferably 1 to 3, more preferably 1 or 2, and still more preferably 2.

The number of hydroxy groups contained in the compound B is, for example, 0 to 4, and it is preferably 0 to 2 and more preferably 1 or 2.

The total number of amino groups and hydroxy groups contained in the compound B is, for example, 3 to 5, and it is preferably 3 or 4 and more preferably 3.

Examples of the compound B include 2-(2-aminoethoxy)ethanol, 2-(2-aminoethylamino)ethanol, 2,2'-oxybis(ethylamine), triethylenetetramine, N,N-bis(2-hydroxyethyl)ethylenediamine, 2-[bis(2-aminoethyl)amino]ethanol, N-methyl-N-(2-hydroxyethyl)ethylenediamine, and N-ethyl-N-(2-hydroxyethyl)ethylenediamine.

Among them, 2-(2-aminoethoxy)ethanol, 2-(2-aminoethylamino)ethanol, or 2,2'-oxybis(ethylamine) is preferable, and 2-(2-aminoethylamino)ethanol or 2,2'-oxybis(ethylamine) is more preferable.

One kind of the compound B may be used alone, or two or more kinds thereof may be used in combination.

The content of the compound B is preferably 0.01% to 10% by mass and more preferably 0.03% to 5% by mass with respect to the total mass of the treatment liquid, and it is still more preferably 0.1% to 1.15% by mass from the viewpoint of more excellent defect suppressibility.

One kind of the amine compound may be used alone, or two or more kinds thereof may be used in combination.

The basic compound preferably contains two or more kinds of amine compounds from the viewpoint of more excellent defect suppressibility.

In a case where the treatment liquid contains two or more kinds of amine compounds, the ratio of the content of the amine compound having the lowest content among the amine compounds to the content of the amine compound having the highest content among the amine compounds in the treatment liquid is preferably 2 to 1,000 in terms of mass ratio, and it is more preferably 9 to 100 from the viewpoint of more excellent defect suppressibility.

The content of the amine compound is not particularly limited; however, it is preferably 0.01% to 30% by mass and more preferably 0.1% to 20% by mass with respect to the total mass of the treatment liquid.

(Quaternary Ammonium Compound)

The treatment liquid may include, as a removing agent, a quaternary ammonium compound which is a compound having one quaternary ammonium cation or a salt thereof in the molecule.

The quaternary ammonium compound is not particularly limited as long as it is a compound having one quaternary ammonium cation in which a nitrogen atom is substituted with four hydrocarbon groups (preferably an alkyl group), or a salt thereof.

Examples of the quaternary ammonium compound include a quaternary ammonium hydroxide, a quaternary ammonium fluoride, a quaternary ammonium bromide, a quaternary ammonium iodide, a quaternary ammonium acetate, and a quaternary ammonium carbonate.

The quaternary ammonium compound is preferably a quaternary ammonium hydroxide and more preferably a compound represented by Formula (a1).

(a1)

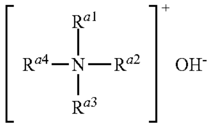

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{a1}$ to $R^{a4}$ may be bonded to each other to form a cyclic structure.

From the viewpoint of ease of availability, the compound represented by Formula (a1) is preferable at least one selected from the group consisting of tetramethylammonium hydroxide (TMAH), tetraethylammonium hydroxide (TEAH), tetrapropylammonium hydroxide, tetrabutylammonium hydroxide (TBAH), methyltripropylammonium hydroxide, methyltributylammonium hydroxide, ethyltrimethylammonium hydroxide, dimethyldiethylammonium hydroxide, benzyltrimethylammonium hydroxide (BzTMAH), hexadecyltrimethylammonium hydroxide, (2-hydroxyethyl)trimethylammonium hydroxide, and spiro-(1,1')-bipyrrolidinium hydroxide, more preferably TMAH, TEAH, TBAH, or BzTMAH, and still more preferably TMAH, TEAH, or TBAH.

One kind of the quaternary ammonium compound may be used alone, or two or more kinds thereof may be used in combination.

The content of the quaternary ammonium compound is preferably 0.01% to 30% by mass and more preferably 0.1% to 20% by mass with respect to the total mass of the treatment liquid.

The basic compound is preferably a quaternary ammonium compound or an amine compound, more preferably a compound represented by Formula (a1), an alkanol amine, or a hydroxylamine compound, and still more preferably tetramethylammonium hydroxide, monoethanolamine, or hydroxylamine. Further, the basic compound is also preferably an amine compound B represented by Formula (2).

One kind of the basic compound may be used alone, or two or more kinds thereof may be used in combination.

The content of the basic compound in the treatment liquid is preferably 0.01% to 30% by mass and more preferably 0.1% to 20% by mass with respect to the total mass of the treatment liquid.

<Hexylene Glycol>

The present treatment liquid contains hexylene glycol.

The content of the hexylene glycol is preferably 40% by mass or more with respect to the total mass of the treatment liquid, and it is more preferably 60% by mass or more and still more preferably 75% by mass or more from the viewpoint that the effect of the present invention is more excellent. The upper limit thereof is not particularly limited; however, it is preferably 98% by mass or less and more preferably 90% by mass or less.

<Compound A>

The present treatment liquid contains a compound A that is at least one kind selected from the group consisting of isobutene, (E)-2-methyl-1,3-pentadiene, 4-methyl-1,3-pentadiene, 2,2,4-trimethyloxetane, 4-methyl-3-penten-2-ol, and 2,4,4,6-tetramethyl-1,3-dioxane.

Due to further containing the compound A in addition to the basic compound and the hexylene glycol, the present treatment liquid can exhibit excellent residue removability, which is the effect of the present invention.

From the viewpoint that the effect of the present invention is more excellent, the compound A is preferably at least one kind selected from the group consisting of isobutene, 4-methyl-1,3-pentadiene, 2,2,4-trimethyloxetane, and 4-methyl-3-penten-2-ol.

The content of the compound A in the treatment liquid is not particularly limited. However, in a case where the treatment liquid contains one kind of the compound A, the content of the compound A is preferably 10,000 ppm by mass or less and more preferably 3,000 ppm by mass with respect to the total mass of the treatment liquid, and it is still more preferably 1,500 ppm by mass or less and particularly preferably 1,000 ppm by mass or less from the viewpoint of more excellent defect suppressibility.

The lower limit thereof is not particularly limited; however, it is preferably 1 ppm by mass or more and more preferably 10 ppm by mass or more with respect to the total mass of the treatment liquid.

In a case where the treatment liquid contains two or more kinds of the compounds A, the contents of the respective compounds A with respect to the total mass of the treatment liquid is preferably 10,000 ppm by mass or less and more preferably 3,000 ppm by mass, and it is still more preferably 1,000 ppm by mass or less from the viewpoint of more excellent defect suppressibility. The lower limit thereof is not particularly limited; however, the content of the compound having the highest content among the two or more kinds of the compounds A is preferably 1 ppm by mass or more and more preferably 10 ppm by mass or more with respect to the total mass. In addition, the content of the compound other than the compound having the highest content among the two or more kinds of the compounds A is preferably 0.1 ppm by mass or more and more preferably 1 ppm by mass or more with respect to the total mass of the treatment liquid.

The compound A may be used alone, or two or more kinds thereof may be used in combination. However, the treatment liquid preferably contains two or more kinds of the compounds A and more preferably contains three or more kinds of the compounds A from the viewpoint that the effect of the present invention is more excellent.

In a case where the treatment liquid contains two or more kinds of the compounds A and in a case where a content of a compound having a highest content among the compounds A is denoted by $\alpha$ and a content of a compound having a second highest content among the compounds A is denoted by $\beta$ in the treatment liquid, a ratio $\alpha/\beta$ of the content $\alpha$ to the content $\beta$ is preferably less than 50 in terms of mass ratio, and it is more preferably less than 10 in terms of mass ratio from the viewpoint that the defect suppressibility is more excellent.

The lower limit of the ratio $\alpha/\beta$ is not particularly limited and may be 1 or more. That is, "the content $\alpha$ of the compound having the highest content among the compounds A" described above and "the content $\beta$ of the compound having the second highest content" described above may be substantially the same amount. In a case where the treatment liquid contains two or more kinds of the compounds A having the same content as "the content $\alpha$ of the compound having the highest content among the compounds A", each of "the compound having the highest content" described above and "the compound having the second highest content" described above is randomly selected from the compounds A having the content $\alpha$.

In addition, in a case where the treatment liquid contains three or more kinds of the compounds A and in a case where the content of the compound having the second highest content among the compounds A is denoted by $\beta$ and the content of the compound having the third highest content among the compounds A is denoted by $\gamma$ in the treatment liquid, the ratio $\beta/\gamma$ of the content $\beta$ to the content $\gamma$ is preferably less than 50 in terms of mass ratio, and it is more preferably less than 10 in terms of mass ratio from the viewpoint that the defect suppressibility is more excellent.

The lower limit of the ratio β/γ is not particularly limited and may be 1 or more. That is, "the content β of the compound having the second highest content among the compounds A" described above and "the content γ of the compound having the third highest content" described above may be substantially the same amount. In a case where the treatment liquid contains two or more kinds of the compounds A having the same content as "the content β of the compound having the second highest content among the compounds A", each of "the compound having the second highest content" described above and "the compound having the third highest content" described above is randomly selected from the compounds A having the content β.

The total content of the compound A in the treatment liquid is not particularly limited; however, it is preferably 20,000 ppm by mass or less, more preferably 5,000 ppm by mass or less, and still more preferably 1,500 ppm by mass or less, with respect to the total mass of the treatment liquid. The lower limit of the total content of the compound A is not particularly limited. However, it is preferably 1 ppm by mass or more and more preferably 10 ppm by mass or more with respect to the total mass of the treatment liquid, and it is still more preferably 50 ppm by mass or more and particularly preferably 400 ppm by mass or more from the viewpoint that the effect of the present invention is more excellent.

<Optional Component>

The treatment liquid may further contain a component other than the above-described components. Hereinafter, optional components that may be contained in the treatment liquid will be described in detail.

(Organic Solvent)

The treatment liquid may include an organic solvent. The hexylene glycol and the compound A are not included in the organic solvent.

The organic solvent is not particularly limited; however, it is preferably a hydrophilic organic solvent. In the present specification, the hydrophilic organic solvent is intended to be an organic solvent, where an amount of 0.1 g or more of the organic solvent is dissolved in 100 g of water under a condition of 25° C. The hydrophilic organic solvent is preferably an organic solvent that can be uniformly mixed with water at any mixing ratio.

Examples of the hydrophilic organic solvent include a glycol-based solvent, a glycol ether-based solvent, an amide-based solvent, an alcohol-based solvent, and a sulfoxide-based solvent.

Examples of the glycol-based solvent include ethylene glycol, propylene glycol, diethylene glycol, dipropylene glycol, triethylene glycol, and tetraethylene glycol.

Examples of the glycol ether-based solvent include glycol monoether.

Examples of the glycol monoether include ethylene glycol monomethyl ether, ethylene glycol monoethyl ether, ethylene glycol mono-n-propyl ether, ethylene glycol monoisopropyl ether, ethylene glycol mono-n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the amide-based solvent include N,N-dimethylformamide, 1-methyl-2-pyrrolidone, 2-pyrrolidinone, 1,3-dimethyl-2-imidazolidinone, formamide, N-methylformamide, acetamide, N-methylacetamide, N,N-dimethylacetamide, N-methylpropanamide, and hexamethylphosphoric triamide.

Examples of the alcohol-based solvent include alkanediol, alkoxyalcohol, saturated aliphatic monovalent alcohol, and unsaturated non-aromatic monovalent alcohol.

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of the alkoxy alcohol include 3-methoxy-3-methyl-1-butanol, 3-methoxy-1-butanol, and 1-methoxy-2-butanol.

Examples of the saturated aliphatic monovalent alcohol include methanol, ethanol, n-propyl alcohol, isopropanol (isopropyl alcohol), 1-butanol, 2-butanol, isobutyl alcohol, tert-butyl alcohol, 2-pentanol, t-pentyl alcohol, and 1-hexanol.

Examples of the unsaturated non-aromatic monovalent alcohol include allyl alcohol, propargyl alcohol, 2-butenyl alcohol, 3-butenyl alcohol, and 4-penten-2-ol.

Examples of the low molecular weight alcohol having a ring structure include tetrahydrofurfuryl alcohol, furfuryl alcohol, and 1,3-cyclopentanediol.

Examples of the sulfoxide-based solvent include dimethyl sulfoxide.

One kind of the organic solvent may be used alone, or two or more kinds thereof may be used in combination.

In a case where the treatment liquid contains an organic solvent, the content of the organic solvent is preferably 0.001% to 10% by mass and more preferably 0.01% to 3% by mass with respect to the total mass of the treatment liquid.

(Chelating Agent)

The treatment liquid may contain a chelating agent.

The chelating agent is a compound having a function of chelating with a metal element, and as a result of the chelation, it has a function of removing residues such as an etching residue and an ashing residue.

Examples of the chelating agent include a polyaminopolycarboxylic acid and a polycarboxylic acid.

The polyaminopolycarboxylic acid is a compound having a plurality of amino groups and a plurality of carboxylic acid groups in one molecule, and examples thereof include a mono- or polyalkylene polyamine polycarboxylic acid, a polyaminoalkane polycarboxylic acid, a polyaminoalkanol polycarboxylic acid, and a hydroxyalkyl ether polyamine polycarboxylic acid.

Examples of the polyaminopolycarboxylic acid-based organic acid include butylenediaminetetraacetic acid, diethylenetriaminepentacetic acid (DTPA), ethylenediaminetetrapropionic acid, triethylenetetraminehexacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid (Cy-DTA), ethylenediaminediacetic acid, ethylenediaminedipropionic acid, 1,6-hexamethylene-diamine-N,N,N',N'-tetraacetic acid, N,N-bis(2-hydroxybenzyl) ethylenediamine-N,N-diacetic acid, diaminopropanetetraacetic acid, 1,4,7,10-tetraazacyclododecane-tetraacetic acid, diaminopropanoltetraacetic acid, and (hydroxyethyl)ethylenediaminetriacetic acid.

Among them, diethylenetriaminepentacetic acid (DTPA), ethylenediaminetetraacetic acid (EDTA), or trans-1,2-diaminocyclohexanetetraacetic acid (Cy-DTA) is preferable.

The polycarboxylic acid is a compound having a plurality of carboxylic acid groups in one molecule. However, the above-described polyaminopolycarboxylic acid is not included in the polycarboxylic acid.

Examples of the polycarboxylic acid include citric acid, malonic acid, maleic acid, succinic acid, malic acid, and tartaric acid.

The treatment liquid may contain a chelating agent other than the above. Examples of another chelating agent include a compound having at least two nitrogen-containing groups and no carboxy group. Specific examples of such a compound include at least one biguanide compound selected from the group consisting of a compound having a biguanide group and a salt thereof.

In addition, as a chelating agent, the chelating agent described in JP2017-504190A can also be used, and the content described in this document is incorporated in the present specification.

One kind of the chelating agent may be used singly, or two or more kinds thereof may be used in combination.

The content of the chelating agent is not particularly limited; however, it is preferably 0.01% to 10% by mass and more preferably 0.01% to 3.0% by mass with respect to the total mass of the treatment liquid.

(Fluorine-Containing Compound)

Examples of the fluorine-containing compound include hydrofluoric acid (fluorinated acid), ammonium fluoride, tetramethylammonium fluoride, and tetrabutylammonium fluoride, where hydrofluoric acid, ammonium fluoride, or tetramethylammonium fluoride is preferable. The fluorine-containing compound has a function of removing residues in the treatment liquid.

The fluorine-containing compound is preferably hydrofluoric acid.

One kind of the fluorine-containing compound may be used singly, or two or more kinds thereof may be used in combination.

The content of the fluorine-containing compound (in a case where two or more kinds thereof are present, the total thereof) in the treatment liquid is preferably 0.01% to 5.0% by mass and more preferably 0.1% to 2.0% by mass with respect to the total mass of the treatment liquid.

(Acidic Compound)

The treatment liquid may contain an acidic compound in order to adjust the pH of the treatment liquid.

The acidic compound may be an inorganic acid or may be an organic acid (excluding the above-described chelating agent).

Examples of the inorganic acid include sulfuric acid, hydrochloric acid, acetic acid, nitric acid, and phosphoric acid, where sulfuric acid, hydrochloric acid, or acetic acid is preferable. Examples of the organic acid include lower (1 to 4 carbon atoms) aliphatic monocarboxylic acids such as formic acid, acetic acid, propionic acid, and butyric acid. In addition, the above-described chelating agent may also serve as an acidic compound.

One kind of the acidic compound may be used alone, or two or more kinds thereof may be used in combination.

In a case where an acidic compound is used so that the pH of the treatment liquid is within a preferred range described below, the kind of the acidic compound to be used may be appropriately selected and the content thereof may be adjusted according to the kind and content of the basic compound contained in the treatment liquid.

(Metal Component)

The treatment liquid may contain a metal component.

Examples of the metal component include metal particles and metal ions. For example, in a case of being referred to as the content of the metal component, it indicates the total content of metal particles and metal ions.

The treatment liquid may contain either metal particles or metal ions, or it may contain both metal particles and metal ions.

Examples of the metal atom contained in the metal component include an metal atom selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, and Zn.

The metal component may contain one kind of metal atom or two or more kinds thereof.

The metal particle may be a single body or an alloy or may be present in a form in which the metal is associated with an organic substance.

The metal component may be a metal component unavoidably contained in each component (raw material) contained in the treatment liquid or may be a metal component unavoidably contained during the production, storage, and/or transfer of the treatment liquid, and it may be added intentionally.

In a case where the treatment liquid contains a metal component, the content of the metal component is preferably 0.01 ppt by mass to 10 ppm by mass with respect to the total mass of the treatment liquid.

It is noted that the kind and content of the metal component in the treatment liquid can be measured by an SP-ICP-MS method (single nano particle inductively coupled plasma mass spectrometry).

Here, the SP-ICP-MS method is different from a general SP-ICP-MS method (an inductive coupling plasma mass analysis method) only in data analysis but uses the same apparatus as in the general SP-ICP-MS method. The data analysis of the SP-ICP-MS method can be carried out by commercially available software.

In the ICP-MS method, the content of the metal component to be measured is measured regardless of the existence form thereof. As a result, the total mass of metal particles to be measured and metal ions is quantified as the content of the metal component.

The method of adjusting the content of each metal component in the treatment liquid is not particularly limited. For example, the content of the metal component in the treatment liquid can be reduced by carrying out a known treatment of removing a metal from the treatment liquid and/or from a raw material containing each component that is used in the preparation of the treatment liquid. In addition, the content of the metal component in the treatment liquid can be increased by adding a compound containing metal ions to the treatment liquid.

(Corrosion Inhibitor)

The treatment liquid may contain a corrosion inhibitor.

The corrosion inhibitor has a function of preventing corrosion of a metal layer due to over-etching or the like, by coordinating and forming a film on the surface of the metal layer serving as wires of a semiconductor device.

It is noted that in the present specification, the above-described chelating agent (a compound having chelating ability) is not included in the corrosion inhibitor.

The corrosion inhibitor is not particularly limited. However, examples thereof include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyltriazole, 3-amino-5-mercapto-1,2,4-triazole, 1-amino- 1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzoimidazole (2-MBI), 4-methyl-2-phenylimidazole, 2-mercaptothiazoline, 2,4-diamino-6-methyl-1,3,5-triazine, thiazole, imidazole, benzoimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, pyrazoles, propanethiol, silanes, benzohydroxamic acids, a heterocyclic nitrogen inhibitor, citric acid, ascorbic acid, thiourea, 1,1,3,3-tetramethylurea, urea, urea derivatives, uric acid, potassium ethylxanthogenate, glycine, dodecylphosphonic acid, imminodiacetic acid, boric acid, malonic acid, succinic acid, nitrilotriacetic acid, sulfolane, 2,3,5-trimethylpyrazine, 2-ethyl-3,5-dimethylpyrazine, quinoxaline, acetylpyrrole, pyridazine, histadine, pyrazine, glutathione (reduced type), cysteine, cystine, thiophene, mercaptopyridine N-oxide, thiamine HCl, tetraethylthiumam disulfide, 2,5-dimercapto-1,3-thiadiazole ascorbic acid, ascorbic acid, catechol, t-butyl catechol, phenol, and pyrogallol.

Examples of the corrosion inhibitor include a substituted or unsubstituted benzotriazole (hereinafter, also referred to as a "benzotriazole compound"). The substitution-type benzotriazole is preferably benzotriazole substituted with an alkyl group, an aryl group, a halogen group, an amino group, a nitro group, an alkoxy group, or a hydroxyl group. The substitution-type benzotriazole also includes those fused with one or more aryl groups (for example, a phenyl group) or a heteroaryl group.

Examples of the benzotriazole compound suitable as the corrosion inhibitor include benzotriazole (BTA), 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-aminobenzotriazole, 5-methyl-1H-benzotriazole (5MBTA), benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl) benzotriazole.

In addition, examples of the benzotriazole compound include 2,2'-{[(4-methyl-1H-benzotriazole-1-yl)methyl]imino}bisethanol, 2,2'-{[(5-methyl-1H-benzotriazole-1-yl)methyl]imino}bisethanol, 2,2'-{[(4-methyl-1H-benzotriazole-1-yl)methyl]imino}bisethane, or 2,2'-{[(4-methyl-1H-benzotriazole-1-yl)methyl]imino}bispropane, and N,N-bis(2-ethylhexyl)-(4 or 5)-methyl-1H-benzotriazole-1-methylamine.

The corrosion inhibitor preferably includes at least one compound selected from the group consisting of a compound represented by Formula (A), a compound represented by Formula (B), a compound represented by Formula (C), and a substituted or unsubstituted tetrazole.

Formula (A)

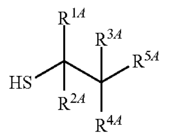

Formula (B)

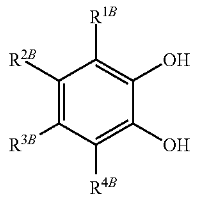

Formula (C)

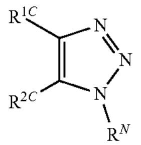

In Formula (A), $R^{1A}$ to $R^{5A}$ each independently represent a hydrogen atom, a substituted or unsubstituted hydrocarbon group, a hydroxyl group, a carboxy group, or a substituted or unsubstituted amino group. However, the structure includes at least one group selected from a hydroxyl group, a carboxy group, and a substituted or unsubstituted amino group.

In Formula (B), $R^{1B}$ to $R^{4B}$ each independently represent a hydrogen atom or a substituted or unsubstituted hydrocarbon group.

In Formula (C), $R^{1C}$, $R^{2C}$, and $R^{N}$ each independently represent a hydrogen atom or a substituted or unsubstituted hydrocarbon group. In addition, $R^{1C}$ and $R^{2C}$ may be bonded to each other to form a ring.

Examples of the compound represented by Formula (A) include 1-thioglycerol, L-cysteine, and thiomalic acid.

Examples of the compound represented by Formula (B) include catechol and t-butyl catechol.

Examples of the compound represented by Formula (C) include 1H-1,2,3-triazole, benzotriazole, 5-methyl-1H-benzotriazole, tolyltriazole, 2,2'-{[(4-methyl-1H-benzotriazole-1-yl)methyl]imino}bisethanol (product name "IRGAMET 42", manufactured by BASF SE), and N,N-bis(2-ethylhexyl)-(4 or 5)-methyl-1H-benzotriazole-1-methylamine (product name "IRGAMET 39", manufactured by BASF SE).

One kind of the corrosion inhibitor may be used alone, or two or more kinds thereof may be used in combination.

The content of the corrosion inhibitor in the treatment liquid is preferably 0.01% to 5% by mass, more preferably 0.05% to 5% by mass, and still more preferably 0.1% to 3% by mass with respect to the total mass of the treatment liquid.

As the corrosion inhibitor, a corrosion inhibitor of a high-purity grade is preferably used, which is more preferably used by being further purified.

The method of purifying the corrosion inhibitor is not particularly limited. However, for example, a known method such as filtration, ion exchange, distillation, adsorption purification, recrystallization, reprecipitation, sublimation, or purification using a column is used, and this method can be also applied in combination.

The treatment liquid may contain an additive other than the above components. Examples of the additive include a surfactant, an antifoaming agent, a rust inhibitor, and a preservative.

[Physical Properties of Treatment Liquid]

<pH>

The pH of the treatment liquid is not particularly limited; however, the pH of the treatment liquid after being diluted with water 10 times by volume is preferably more than 7, more preferably 7.5 or more, and still more preferably 8.0 or more since a treatment liquid by which the effect of the present invention is more excellent is obtained. The upper limit thereof is not particularly limited; however, it is preferable that the pH of the treatment liquid after being diluted with water 10 times by volume is 12.0 or less at 25° C.

The pH of the treatment liquid is a value obtained by carrying out measurement at 25° C. using a known pH meter.

<Coarse Particle>

It is preferable that the treatment liquid is substantially free of coarse particles.

The coarse particles refer to particles having a diameter of 0.2 μm or more in a case where the shape of the particles is regarded as a sphere. In addition, a case of being substantially free of coarse particles refers to that ten or fewer particles of 0.2 μm or more are present in 1 mL of the treatment liquid in a case where the treatment liquid is subjected to measurement using a commercially available measuring device in the light scattering type in-liquid particle measuring method.

It is noted that the coarse particles contained in the treatment liquid are particles or the like of dirt, dust, organic solids, inorganic solids, and the like contained as impurities in raw materials, and particles of dirt, dust, and organic solids, and inorganic solids brought in as contaminants during the preparation of the treatment liquid, which correspond to the particles that are finally present as particles without being dissolved in the treatment liquid.

The amount of the coarse particles present in the treatment liquid can be measured in the liquid phase using a commercially available measuring device in a light scattering type in-liquid particle measuring method using a laser as a light source.

Examples of the method of removing coarse particles include a purification treatment such as filtering.

[Kit]

The raw materials of the treatment liquid may be divided into a plurality of parts to be used as a kit for preparing the treatment liquid. Examples of the kit for preparing the treatment liquid include a kit (hereinafter, also described as a "kit A") including a first liquid containing at least water and a basic compound and a second liquid containing at least hexylene glycol and the compound A.

The first liquid of the kit A may contain a component other than water and the basic compound; however, it preferably does not contain hexylene glycol and the compound A. In addition, the second liquid of the kit A may contain a component other than hexylene glycol and the compound A; however, it preferably does not contain the basic compound.

The content of each component included in the first liquid and the second liquid provided in the kit is not particularly limited; however, the content of each component in the treatment liquid prepared by mixing the first liquid and the second liquid is preferably an amount corresponding to the preferred amount described above.

The pH of each of the first liquid and the second liquid provided in the kit is not particularly limited, and it suffices that the pH is adjusted so that the pH of the treatment liquid prepared by mixing the first liquid and the second liquid is included in the above-described range.

In addition, the treatment liquid may be prepared as a concentrated solution. In this case, it can be diluted with a diluent liquid at the time of use. The diluent liquid is not particularly limited, and examples thereof include water and hexylene glycol. That is, the kit for preparing the treatment liquid may be a kit including the treatment liquid in the form of a concentrated solution and the diluent liquid.

[Use Application]

Next, the use application of the treatment liquid involved in the above-described embodiment will be described.

The treatment liquid is a treatment liquid for a semiconductor device. In the present specification, "for a semiconductor device" means that it is used in the manufacture of a semiconductor device. The treatment liquid can be used in any step for manufacturing a semiconductor device and can be used, for example, for treating an insulating film, a resist film, an antireflection film, an etching residue, an ashing residue, and the like, which are present on a substrate. It is noted that in the present specification, the etching residue and the ashing residue are collectively referred to as residues. In addition, the treatment liquid may be used for treating a substrate after chemical mechanical polishing.

Specifically, the treatment liquid can be used as a pre-wet liquid to be applied on a substrate to improve the coatability of an actinic ray-sensitive or radiation-sensitive composition before the step of forming a resist film using the composition, a washing solution that is used for removing residues that have adhered on a substrate, a solution (for example, a removal liquid, a stripping liquid, or the like) that is used for removing various resist films for pattern formation, a solution (for example, a removal liquid, a stripping liquid, or the like) that is used for removing a permanent film (for example, a color filter, a transparent insulating film, a lens made of a resin) or the like from a semiconductor substrate, or the like. It is noted that since the semiconductor substrate after the removal of the permanent film may be used again for the use of the semiconductor device, the removal of the permanent film is included in the manufacturing step of the semiconductor device.

In addition, the treatment liquid can also be used as a washing solution that is used for removing residues such as metal impurities or fine particles from a substrate after chemical mechanical polishing.

Among the above-described use applications, in particular, it can be suitably used as a washing solution for removing residues from a substrate or a washing solution for removing residues from a substrate after chemical mechanical polishing.

The treatment liquid may be used in only one use application or two or more of use applications among the above-described use applications.

The treatment liquid can also be used for treating a substrate including a metal layer that contains at least one selected from the group consisting of Co, W, Cu, Mo, and Ru. In addition, the treatment liquid can also be used for treating a substrate of a semiconductor device which includes a layer containing at least one selected from the group consisting of SiOx, SiN, and SiOC (x represents a number of 1 to 3).

[Production Method for Treatment Liquid]

<Treatment Liquid Preparation Step>

The production method for the treatment liquid is not particularly limited, and a known production method can be used. Examples of the production method for the treatment liquid include a method having at least a treatment liquid preparation step of preparing respective components of the above-described water, basic compound, hexylene glycol, compound A, and optional component and then mixing the above-described respective components to prepare a treatment liquid.

In the treatment liquid preparation step, the order in which the respective components are mixed is not particularly limited. It is preferable that respective liquids provided in a kit are also produced according to the same method as described above.

The method for producing the kit is not particularly limited. For example, after preparing the first liquid and the second liquid described above, the first liquid and the second liquid are respectively accommodated in containers different from each other to produce a kit for preparing the treatment liquid.

<Filtration Step>

It is preferable that the production method includes a filtration step of filtering a liquid in order to remove foreign matters, coarse particles, and the like from the liquid.

The filtration method is not particularly limited, and a known filtration method can be used. Among the above, filtering using a filter is preferable.

The filter that is used for filtering can be used without particular limitation as long as it is a filter that is conventionally used in the use application of filtering and the like. Examples of the material constituting the filter include a fluororesin such as polytetrafluoroethylene (PTFE), a polyamide-based resin such as nylon, and a polyolefin-based resin (having a high density and an ultrahigh molecular weight) such as polyethylene or polypropylene (PP).

Among them, a polyamide-based resin, PTFE, and polypropylene (including high-density polypropylene) are preferable.

In a case of using a filter formed from these materials, it is possible to more effectively remove foreign matters having high polarity, which are likely to cause defects, from the treatment liquid.

The lower limit value of the critical surface tension of the filter is preferably 70 mN/m or more, and the upper limit value thereof is preferably 95 mN/m or less. Among the above, the critical surface tension of the filter is more preferably 75 to 85 mN/m.

It is noted that the value of the critical surface tension is a nominal value of a manufacturer. In a case of using a filter having a critical surface tension in the above range, it is possible to more effectively remove foreign matters having high polarity, which are likely to cause defects, from the treatment liquid.

The pore diameter of the filter is preferably about 0.001 to 1.0 μm, more preferably about 0.02 to 0.5 μm, and still more preferably about 0.01 to 0.1 μm. In a case of setting the pore diameter of the filter within the above range, it is possible to reliably remove fine foreign matters contained in the treatment liquid while suppressing filtration clogging.

In a case of using a filter, different filters may be combined. In this case, filtering with a first filter may be carried out only once, or may be carried out twice or more times. In a case where different filters are combined and filtering is carried out two or more times, the kinds of filters may be the same or different from each other; however, the kinds of filters are preferably different from each other. Typically, it is preferable that at least one of the pore diameter or the constitutional material is different between the first filter and the second filter.

It is preferable that the pore diameters of the second and subsequent filtering are equal to or smaller than the pore diameter of the first filtering. In addition, the first filters having different pore diameters within the above range may be combined. With regard to the pore diameters herein, reference can be made to nominal values of filter manufacturers. A commercial filter can be selected from various filters provided by, for example, Nihon Pall Ltd., Advantec Toyo Kaisha, Ltd., Nihon Entegris K. K. (formerly Nippon Microlith Co., Ltd.), and Kitz Micro Filter Corporation. In addition, the following filters can also be used: "P-nylon filter (pore diameter: 0.02 μm, critical surface tension: 77 mN/m)" made of polyamide (manufactured by Nihon Pall Ltd.); "PE clean filter (pore diameter: 0.02 μm)" made of high-density polyethylene (manufactured by Nihon Pall Ltd.); and "PE clean filter (pore diameter: 0.01 μm)" made of high-density polyethylene (manufactured by Nihon Pall Ltd.).

As the second filter, a filter formed of the same material as that of the first filter can be used. A filter having the same pore diameter as that of the first filter described above can be used. In a case where the second filter having a pore diameter smaller than that of the first filter is used, the ratio of the pore diameter of the second filter to the pore diameter of the first filter (the pore diameter of the second filter/the pore diameter of the first filter) is preferably 0.01 to 0.99, more preferably 0.1 to 0.9, and still more preferably 0.3 to 0.9. In a case of setting the pore diameter of the second filter within the above range, fine foreign matters mixed in the treatment liquid are more reliably removed.

For example, filtering with the first filter may be carried out with a mixed liquid containing a part of components of the treatment liquid, and after mixing the remaining components with the mixed liquid to prepare the treatment liquid, the second filtering may be carried out.

In addition, it is preferable that the filter to be used is treated before filtering the treatment liquid. The liquid that is used for this treatment is not particularly limited; however, it is preferably the treatment liquid or a liquid containing components that are contained in the treatment liquid.

In a case of carrying out filtering, the upper limit value of the temperature during filtering is preferably room temperature (25° C.) or lower, more preferably 23° C. or lower, and still more preferably 20° C. or lower. The lower limit value of the temperature at the time of filtering is preferably 0° C. or higher, more preferably 5° C. or higher, and still more preferably 10° C. or higher.

In the filtering, particulate foreign matters and/or impurities can be removed. However, in a case where the filtering is carried out at the above temperature, the amount of the particulate foreign matters and/or impurities dissolved in the treatment liquid is reduced, and thus the filtering is carried out more efficiently.

<Destaticization Step>

The production method may further include a destaticization step of destaticizing the treatment liquid. A specific method for destaticization will be described later.

It is preferable that all the steps involved in the production method are carried out in a clean room. It is preferable that the clean room satisfies 14644-1 clean room standards. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

<Container>

The container that accommodates the above-described treatment liquid or kit is not particularly limited as long as the corrosiveness due to the liquid does not cause a problem, and a known container can be used.

The container is preferably a container for a use application in a semiconductor, which has high internal cleanliness and hardly causes elution of impurities.

Specific examples of the container include "CLEAN BOTTLE" series manufactured by AICELLO CHEMICAL Co., Ltd. and "PURE BOTTLE" manufactured by KODAMA PLASTICS Co., Ltd. In addition, for the intended purpose of preventing the mixing (contamination) of raw materials and impurities into the chemical liquid, it is also preferable to use a multi-layer container in which an inner wall of the container has a six-layer structure consisting of six kinds of resins and a multi-layer container in which an inner wall of the container has a seven-layer structure consisting of six kinds of resins. Examples of these containers include a container described in JP2015-123351A, which are not limited thereto.

The inner wall of the container is preferably formed of or coated with one or more resins selected from the group consisting of a polyethylene resin, a polypropylene resin, and a polyethylene-polypropylene resin, a resin different from these, and a metal such as stainless steel, HASTELLOY, INCONEL, or MONEL.

As the above-described different resin, a fluorine-based resin (a perfluororesin) can be preferably used. In this manner, by using a container in which an inner wall of the container is formed of a fluorine-based resin or coated with a fluororesin, the occurrence of a problem of elution of ethylene or propylene oligomers can be suppressed, as compared with a case of using a container in which an inner wall of the container is formed of or coated with a polyethylene resin, a polypropylene resin, or a polyethylene-polypropylene resin.

Specific examples of such a container having an inner wall include a FluoroPure PFA composite drum manufactured by Entegris Inc. In addition, it is also possible to use the containers described on page 4 of the pamphlet of JP1991-502677A (JP-H3-502677A), page 3 of the pamphlet of WO2004/016526A, pages 9 and 16 of the WO99/046309A, and the like.

Further, for the inner wall of the container, quartz and an electropolished metal material (that is, a completely electropolished metal material) are also preferably used, in addition to the above-described fluorine-based resin.

The metal material used that is for producing the electropolished metal material is preferably a metal material which contains at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is preferably 25% by mass or more and more preferably 30% by mass or more with respect to the total mass of the metal material.

It is noted that the upper limit value of the total content of Cr and Ni in the metal material is not particularly limited; however, it is preferably 90% by mass or less.

The stainless steel is not particularly limited, and known stainless steels can be used. Among them, an alloy containing nickel at 8% by mass or more is preferable, and an austenitic stainless steel containing nickel at 8% by mass or more is more preferable. Examples of the austenitic stainless steels include SUS (Steel Use Stainless) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

The nickel-chromium alloy is not particularly limited, and known nickel-chromium alloys can be used. Among them, a nickel-chromium alloy having a nickel content of 40% to 75% by mass and a chromium content of 1% to 30% by mass is preferable.

Examples of the nickel-chromium alloy include HASTELLOY (product name, the same applies hereinafter), MONEL (product name, the same applies hereinafter), and INCONEL (product name, the same applies hereinafter). More specific examples thereof include HASTELLOY C-276 (Ni content: 63% by mass, Cr content: 16% by mass), HASTELLOY-C (Ni content: 60% by mass, Cr content: 17% by mass), and HASTELLOY C-22 (Ni content: 61% by mass, Cr content: 22% by mass).

In addition, the nickel-chromium alloy may further contain boron, silicon, tungsten, molybdenum, copper, cobalt, and the like as necessary, in addition to the above alloys.

A method of electropolishing a metal material is not particularly limited, and known methods can be used. For example, the methods described in paragraphs [0011] to [0014] of JP2015-227501A, paragraphs [0036] to [0042] of JP2008-264929A, or the like can be used.

In a case where the metal material is electropolished, it is presumed that a content of chromium in a passivation layer on a surface becomes larger than a content of chromium in a primary phase. As a result, it is presumed that since the metal element is unlikely to flow out into the treatment liquid from the inner wall coated with the electropolished metal material, the treatment liquid in which the specific metal element is reduced can be obtained.

The metal material is preferably subjected to buff polishing. A method of buff polishing is not particularly limited, and known methods can be used. The size of abrasive grains for polishing used for buff polishing finish is not particularly limited; however, it is preferably #400 or less from the viewpoint that then unevenness of the surface of the metal material is easily reduced.

The buff polishing is preferably carried out before the electropolishing.

In addition, the metal material may be treated by combining one or two or more of a plurality of stages of buff polishing, acid washing, magnetic fluid polishing, and the like, which are carried out by changing the count of the size or the like of the abrasive grains.

It is preferable to wash the inside of these containers before being filled. The liquid that is used for washing may be appropriately selected according to the intended use; however, it is preferably the treatment liquid, a liquid obtained by diluting the treatment liquid, or a liquid containing at least one of the components which are added to the treatment liquid.

In order to prevent the change in the components in the treatment liquid during storage, the inside of the container may be replaced with inert gas (nitrogen, argon, or the like) with a purity of 99.99995% by volume or more. In particular, a gas having a low moisture content is preferable. Although the liquid container body may be transported and stored at normal temperature, the temperature may be controlled in a range of −20° C. to 20° C. in order to prevent deterioration.

[Substrate Treatment Method]

In a substrate treatment method using the present treatment liquid (hereinafter, also simply referred to as "the present treatment method"), the treatment liquid can be typically used by being brought into contact with a substrate containing a metal-based material which is a material containing a metal. At this time, the substrate may contain a plurality of kinds of metal-based materials. In addition, it is also preferable that the treatment liquid dissolves at least one of metal-based materials contained therein, where a plurality of kinds of the metal-based materials may be contained therein.

It suffices that the metal-based material has metal atoms (cobalt (Co), ruthenium (Ru), molybdenum (Mo), aluminum (Al), copper (Cu), titanium (Ti), tungsten (W), tantalum (Ta), and/or the like), and examples thereof include a single body metal, an alloy, a metal oxide (which may be a composite oxide), and a metal nitride (which may be a composite nitride). In addition, examples of the metal-based material contained in the substrate also include a material that contains at least one selected from the group consisting of a single body metal, an alloy, a metal oxide, and a metal nitride, and at least one element, as a dopant, selected from the group consisting of carbon, nitrogen, boron, and phosphorus.

The content of the metal atom in the metal-based material is preferably 30% to 100% by mass, more preferably 40% to 100% by mass, and still more preferably 52% to 100% by mass, with respect to the total mass of the metal-based material.

In a case where the metal-based material contains the above dopant, the content of the dopant of the metal atom is preferably 0.1% to 50% by mass and more preferably 10% to 40% by mass with respect to the total mass of the metal-based material. In that case, the content of the metal atom in the metal-based material is preferably 30% to 99.9% by mass and more preferably 60% to 90% by mass with respect to the total mass of the metal-based material.

[Substrate Washing Method]

Examples of one embodiment of the present treatment method include a substrate washing method including a washing step B of washing a predetermined substrate using the treatment liquid. The substrate washing method may include a treatment liquid preparation step A of preparing the treatment liquid, before the washing step B.

In the following description of the substrate washing method, a case where the treatment liquid preparation step A is carried out before the washing step B will be described as an example, which is not limited thereto, and the substrate washing may be carried out using the treatment liquid prepared in advance.

[Object to be Washed]

The object to be washed in the washing method is not particularly limited as long as it is a substrate including a metal layer, and the substrate preferably includes a metal layer containing at least one selected from the group consisting of Co, W, Cu, Mo, Ru, Ti, and Al, and it more preferably includes a metal layer containing Co. In addition, the object to be washed is also preferably a substrate further including, in addition to the metal layer, a layer containing at least one selected from the group consisting of SiOx, SiN, SiOC, SiOCN, AlOx, and AlN (x is preferably 1 to 3).

Examples of the object to be washed include a laminate in which at least a metal layer, an interlayer insulating film, and a metal hard mask are provided in this order on a substrate. The laminate may further have holes formed from the surface (the opening portion) of the metal hard mask toward the substrate so that the surface of the metal layer is exposed, as a result of undergoing a dry etching step or the like.

A method of manufacturing such a laminate having holes as described above is not particularly limited, and examples thereof include a method in which a laminate before treatment, having a substrate, a metal layer, an interlayer insulating film, and a metal hard mask in this order, is subjected to a dry etching step by using a metal hard mask as a mask and an interlayer insulating film is etched so that the surface of the metal layer is exposed, thereby providing holes that penetrate through the metal hard mask and the inside of the interlayer insulating film.

A method of manufacturing the metal hard mask is not particularly limited, examples thereof include a method in which, first, a metal layer containing a predetermined component is formed on an interlayer insulating film, a resist film having a predetermined pattern is formed on the metal layer, and then the metal layer is etched by using the resist film as a mask, thereby manufacturing a metal hard mask (that is, a film in which a metal layer is patterned).

In addition, the laminate may have a layer other than the above-described layers, examples of which include an etching stop film and an antireflection layer.

FIG. 1 shows a schematic cross-sectional view illustrating an example of a laminate which is an object to be washed in the substrate washing method.

A laminate 10 illustrated in FIG. 1 includes a metal layer 2, an etching stop layer 3, an interlayer insulating film 4, and a metal hard mask 5 in this order on a substrate 1, and holes 6 by which the metal layer 2 is exposed is formed at a predetermined position as a result of a dry etching step or the like. That is, the object to be washed illustrated in FIG. 1 is a laminate which includes the substrate 1, the metal layer 2, the etching stop layer 3, the interlayer insulating film 4, and the metal hard mask 5 in this order, in which the holes 6 that penetrate from the surface of the metal hard mask 5 to the surface of the metal layer 2 at the position of the opening portion of the metal hard mask 5. An inner wall 11 of the holes 6 is composed of a cross-sectional wall 11*a* consisting of the etching stop layer 3, the interlayer insulating film 4, and the metal hard mask 5, and a bottom wall 11*b* consisting of the exposed metal layer 2, and dry etching residues 12 are attached thereto.

The substrate washing method can be suitably used for washing for the intended purpose of removing these dry etching residues 12. That is, while being excellent in the removal performance for the dry etching residues 12, it is also excellent in the corrosion prevention property with respect to the inner wall 11 (for example, the metal layer 2 and the like) of the object to be washed.

In addition, a laminate that has undergone a dry ashing step after the dry etching step may be subjected to the substrate washing method.

Hereinafter, each layer-constituting material of the above-described laminate will be described.

<Metal Hard Mask>

The metal hard mask preferably contains at least one selected from the group consisting of copper, cobalt, a cobalt alloy, tungsten, a tungsten alloy, ruthenium, a ruthenium alloy, tantalum, a tantalum alloy, aluminum oxide, aluminum nitride, nitrided aluminum oxide, titanium aluminum, titanium, titanium nitride, titanium oxide, zirconium oxide, hafnium oxide, tantalum oxide, lanthanum oxide, and a yttrium alloy (preferably YSiOx). Here, x and y are preferably numbers represented by x=1 to 3 and y=1 to 2, respectively.

TiN, $WO_2$, or $ZrO_2$ is more preferable as the material constituting the metal hard mask.

<Interlayer Insulating Film>

The material of the interlayer insulating film is not particularly limited, and examples thereof include those having a dielectric constant k of 3.0 or less and more preferably 2.6 or less.

Specific examples of the material of the interlayer insulating film include organic polymers such as SiOx, SiN, SiOC, and polyimide. Here, x is preferably a number represented by 1 to 3.

<Etching Stop Layer>

The material of the etching stop layer is not particularly limited. Specific examples of the material of the etching stop layer include materials based on SiN, SiON, and SiOCN, and metal oxides such as AlOx.

<Metal layer>

The material that forms the metal layer, which is a wiring line material and/or a plug material, is not particularly limited. However, it preferably contains one or more selected from the group consisting of cobalt, tungsten, and copper. Further, the material that forms the metal layer may be cobalt, tungsten, or an alloy of copper and another metal.

The metal layer may further contain a metal other than cobalt, tungsten, and copper, a metal nitride, and/or an alloy. Examples of the metal other than cobalt, tungsten, and copper, which may be contained in the metal layer include titanium, titanium-tungsten, titanium nitride, tantalum, a tantalum compound, chromium, a chromium oxide, and aluminum.

The metal layer may contain at least one dopant selected from the group consisting of carbon, nitrogen, boron, and phosphorus, in addition to one or more selected from the group consisting of cobalt, tungsten, and copper.

<Substrate>

The "substrate" referred to herein includes, for example, a semiconductor substrate composed of a single layer and a semiconductor substrate composed of multiple layers.

The material constituting a semiconductor substrate consisting of a single layer is not particularly limited, and it is preferably composed of a Group III-V compound, such as silicon, silicon germanium, or GaAs, or any combination thereof.

In a case of a semiconductor substrate consisting of multiple layers, the configuration thereof is not particularly limited, and it may have exposed integrated circuit structures such as interconnect structures (interconnect features) such as a metal wire and a dielectric material, for example, on the above-described semiconductor substrate such as silicon. Examples of the metal and the alloy which are used in the interconnect structure include aluminum, aluminum alloyed with copper, copper, titanium, tantalum, cobalt, silicon, titanium nitride, tantalum nitride, and tungsten, which are limited thereto. In addition, a layer of an interlayer dielectric layer, silicon oxide, silicon nitride, silicon carbide, or carbon-doped silicon oxide may be provided on the semiconductor substrate.

Hereinafter, the substrate washing method will be described for each step.

[Treatment Liquid Preparation Step A]

The treatment liquid preparation step A is a step of preparing the treatment liquid. Each component that is used in this step is as described above.

The procedure of this step is not particularly limited, and examples thereof include a method of preparing a treatment liquid by stirring and mixing predetermined components. It is noted that each component may be added at one time or may be dividedly added over a plurality of times.

In addition, as each component contained in the treatment liquid, a component classified into a semiconductor grade or a component classified into a high-purity grade equivalent thereto is used, and it is preferable to use a component in which foreign matters are removed by filtering and/or ion components are reduced by an ion exchange resin or the like. In addition, after mixing the raw material components, it is preferable to carry out the removal of foreign matters by filtering and/or the reduction of ion components by an ion exchange resin or the like.

In a case where the treatment liquid is used as a kit, the respective liquids of the kit including the first liquid and the second liquid are mixed before carrying out the washing step B, and then the washing step B is carried out using the obtained mixed liquid. Further, in a case where the treatment liquid is a concentrated solution, the concentrated solution is diluted 5 to 2,000 times to obtain a diluent liquid before carrying out the washing step B, and then the washing step B is carried out using this diluent liquid. Water or hexylene glycol is preferable as a solvent for diluting the concentrated solution.

[Washing Step B]

Examples of the object to be washed in the washing step B include the above-described laminate, and more specific examples thereof include a substrate including a metal layer that contains at least one metal selected from the group consisting of Co, W, and Cu. In addition, examples of the object to be washed include a laminate 10 that has undergone a dry etching step to form holes, as described above (see FIG. 1). It is noted that the dry etching residues 12 adhere to the holes 6 in the laminate 10.

It is noted that a laminate that has undergone a dry ashing step after the dry etching step may be used as the object to be washed.

A method of bringing the treatment liquid into contact with an object to be washed is not particularly limited. However, examples thereof include a method in which an object to be washed is immersed in a treatment liquid charged in a tank, a method in which a treatment liquid is sprayed onto an object to be washed, a method in which a treatment liquid is flown onto an object to be washed, and a combination thereof. From the viewpoint that the effect of the present invention is more excellent, a method of immersing an object to be washed in the treatment liquid is preferable.

The temperature of the treatment liquid is preferably 90° C. or less, more preferably 25° C. to 80° C., still more preferably 30° C. to 75° C., and particularly preferably 40° C. to 65° C.

The washing time can be adjusted according to the washing method to be used and the temperature of the treatment liquid to be used.

In a case of carrying out washing by an immersion batch method (a batch method in which a plurality of objects to be washed are immersed and treated in a treatment tank), the washing time is, for example, within 60 minutes, and it is preferably 1 to 60 minutes, more preferably 3 to 20 minutes, and still more preferably 4 to 15 minutes.

In a case of carrying out washing by the single substrate method, the washing time is, for example, 10 seconds to 5 minutes, and it is preferably 15 seconds to 4 minutes, more preferably 15 seconds to 3 minutes, and still more preferably 20 seconds to 2 minutes.

Further, in order to further improve the washing ability of the treatment liquid, a mechanical stirring method may be used.

Examples of the mechanical stirring method include a method of circulating a treatment liquid on an object to be washed, a method of flowing or spraying a treatment liquid on an object to be washed, and a method of stirring a treatment liquid with an ultrasonic wave or a megasonic wave.

[Rinsing Step B2]

The substrate washing method according to the embodiment of the present invention may further include a step of rinsing the object to be washed with a solvent (hereinafter, referred to as a "rinsing step B2"), after the washing step B.

The rinsing step B2 is carried out continuously after the washing step B, and it is preferably a step of carrying out rising with a rinsing solvent (a rinsing liquid) for 5 seconds to 5 minutes. The rinsing step B2 may be carried out using the above-mentioned mechanical stirring method.

Examples of the solvent of the rinsing liquid include deionized (DI) water, methanol, ethanol, isopropanol, N-methylpyrrolidinone, γ-butyrolactone, dimethyl sulfoxide, ethyl lactate, and propylene glycol monomethyl ether acetate.

The solvent of the rinsing liquid is preferably DI water, methanol, ethanol, isopropanol, or a mixed liquid thereof, and more preferably DI water, isopropanol, or a mixed liquid of DI water and isopropanol.

As a method of bringing the rinsing solvent into contact with the object to be washed, the above-described method of bringing the treatment liquid into contact with the object to be washed can be similarly applied.

The temperature of the rinsing solvent in the rinsing step B2 is preferably 16 to 27° C.

[Drying Step B3]

The substrate washing method according to the embodiment of the present invention may include a drying step B3 of drying the object to be washed, after the rinsing step B2.

The drying method is not particularly limited. Examples of the drying method include a spin drying method, a method of flowing a dry gas onto an object to be washed, a method of heating a substrate by a heating means such as a hot plate and an infrared lamp, a Marangoni drying method, a Rotagoni drying method, an isopropanol (IPA) drying method, and any combinations thereof.

The drying time in the drying step B3 varies depending on the drying method; however, it is preferably 20 seconds to 5 minutes.

In the drying step B3, it is preferable to dry a substrate by heating the substrate with a heating means from the viewpoint of excellent removability of the treatment liquid in the SiOx layer.

The heating temperature is not particularly limited; however, it is preferably 50° C. to 350° C.

[Coarse Particle Removal Step H]

After the treatment liquid preparation step A and before the washing step B, the substrate washing method preferably has a coarse particle removal step H of removing coarse particles in the treatment liquid.

In a case of reducing or removing the coarse particles in the treatment liquid, it is possible to reduce the amount of the coarse particles remaining on the object to be washed after undergoing the washing step B. As a result, it is possible to suppress the pattern damage caused by the coarse particles on the object to be washed, and it is also possible to suppress the influence on the decrease in the yield and the decrease in the reliability of the device.

Examples of the specific method for removing the coarse particles include a method of filtering and purifying the treatment liquid that has undergone the treatment liquid preparation step A, by using a particle removal film having a predetermined particle removal diameter.

It is noted that the definition of the coarse particle is as described above.

[Destaticization Steps I and J]

It is preferable that the substrate washing method include at least one step selected from the group consisting of a destaticization step I of destaticizing the water that is used in the preparation of a treatment liquid before the treatment liquid preparation step A and a destaticization step J of destaticizing the treatment liquid after the treatment liquid preparation step A and before the washing step B.

It is preferable that a material of a liquid contact portion for supplying the treatment liquid to the object to be washed is formed of or coated with a material in which metal elution due to the treatment liquid does not occur. Examples of the above-described material include the material already described as the material involved in the inner wall of the container that can be used in the liquid container body.

The above-described material may be a resin. In a case where the above-described material is a resin, the resin has a low electrical conductivity and insulating properties in a large number of cases. As a result, for example, in a case where the treatment liquid is allowed to pass through a pipe of which the inner wall is formed of or coated with a resin, or in a case where it is subjected to filtration and purification with a particle removal film made of a resin and an ion exchange resin film made of a resin, the charged potential of the treatment liquid may increase, which causes an electrostatic disaster.

Therefore, in the substrate washing method, it is preferable to carry out at least one of the destaticization step I and the destaticization step J described above to reduce the charged potential of the treatment liquid. In addition, in a case of carrying out destaticization, it is possible to further suppress the adhesion of foreign matters (coarse particles or the like) to the substrate and/or the damage (the corrosion) to the object to be washed.

Specific examples of the destaticization method include a method of bringing water and/or the treatment liquid into contact with a conductive material.

The contact time during which the water and/or the treatment liquid is brought into contact with a conductive material is preferably 0.001 to 1 second and more preferably 0.01 to 0.1 second.

Specific examples of the resin include high-density polyethylene (HDPE), high-density polypropylene (PP), 6,6-nylon, tetrafluoroethylene (PTFE), a copolymer (PFA) of tetrafluoroethylene and perfluoroalkyl vinyl ether, polychlorotrifluoroethylene (PCTFE), an ethylene-chlorotrifluoroethylene copolymer (ECTFE), an ethylene-ethylene tetrafluoride copolymer (ETFE), and an ethylene tetrafluoride-propylene hexafluoride copolymer (FEP).

Examples of the conductive material include stainless steel, gold, platinum, diamond, and glassy carbon.

The substrate washing method may be a substrate washing method that has the treatment liquid preparation step A, the washing step B, a waste liquid recovery step C of recovering a waste liquid of the treatment liquid used in the washing step B, a washing step D of washing a substrate including a newly prepared and predetermined layer by using the recovered waste liquid of the treatment liquid, and a waste liquid recovery step E of recovering the waste liquid of the treatment liquid, used in the washing step D, where the washing step D and the waste liquid recovery step E are repeatedly carried out to recycle the waste liquid of the treatment liquid.

In the above-described substrate washing method, the aspects of the treatment liquid preparation step A and the washing step B are as described above. In addition, it is preferable that the aspect of reusing the waste liquid also has the coarse particle removal step H and the destaticization steps I and J, which are described in the above-described aspects. In addition, the treatment liquid preparation step A described in the above-described aspect may be provided before the washing step B.

The aspect of the washing step D, in which substrate washing is carried out using the recovered waste liquid of the treatment liquid is as described above.

The waste liquid recovery means in the waste liquid recovery steps C and E is not particularly limited. The recovered waste liquid is preferably stored in the above-described container in the destaticization step J, and at the time of the storage, the same destaticization step as in the destaticization step J may be carried out. In addition, a step of removing impurities by subjecting the recovered waste liquid to filtration or the like may be provided.

EXAMPLES

Hereinbelow, the present invention will be described in more detail with reference to Examples. The materials, amounts of use, proportions, treatments, procedures, and the like described in the following Examples can be appropriately modified as long as the gist of the invention is maintained. Therefore, the scope of the present invention should not be construed to be limited by Examples described below.

Examples 1 to 74 and Comparative Examples 1 and 2

[Preparation of Treatment Liquid]

Each component shown in Table 1 was prepared and mixed according to the formulation shown in Table 1 to prepare each of treatment liquids of Examples and Comparative Examples. It is noted that in each treatment liquid, the content of each component (all in terms of mass) is as described in the table.

Here, as the components used in this Example, those all classified into a semiconductor grade or a high-purity grade equivalent thereto were used.

<Component>

The various components listed in Table 1 are shown below.

(Water)

Ultrapure water (HG)

Hexylene glycol (Compound A)

A-1: Isobutene

A-2: (E)-2-methyl-1,3-pentadiene

A-3: 4-methyl-1,3-pentadiene

A-4: 2,2,4-trimethyloxetane

A-5: 4-methyl-3-penten-2-ol

A-6: 2,4,4,6-tetramethyl-1,3-dioxane (Basic Compound)

HA: Hydroxylamine ($NH_2OH$) (corresponding to a hydroxylamine compound)

TMAH: Tetramethylammonium hydroxide (corresponding to a quaternary ammonium compound)

MEA: Monoethanolamine (corresponding to a secondary amine)

The prepared treatment liquids of Examples 1 to 74 were diluted 10 times by volume with ultrapure water. As a result of measuring the pH's of the diluted treatment liquids at 25° C. using a pH meter, the pH's all were in a range of 8.0 to 12.0.

[Measurement]

The contents of the compound A and the basic compound contained in each treatment liquid were measured under the following conditions using a gas chromatograph mass spectrometer (product name "GCMS-2020", manufactured by Shimadzu Corporation).

(Measurement Conditions)

Capillary column: InertCap 5MS/NP 0.25 mm I. D.×30 m df=0.25 m

Sample introduction method: Split 75 kPa, constant pressure

Vaporization chamber temperature: 230° C.

Column oven temperature: 80° C. (2 min) to 500° C. (13 min)

Temperature rising rate: 15° C./min

Carrier gas: Helium septum

Purge flow rate: 5 mL/min

Split ratio: 25:1

Interface temperature: 250° C.

Ion source temperature: 200° C.

Measurement mode: Scan m/z=85 to 500

Sample introduction volume: 1 L

[Evaluation]

[Residue Removability]

A laminate in which a Co film, a SiN film, a $SiO_2$ film, a metal hard mask (TiN), and a resist film were laminated in this order on a substrate (Si) was prepared. This multilayer substrate was subjected to a patterning treatment by lithography, an etching treatment using a plasma etching apparatus for metal, and a removal treatment of a resist film by oxygen plasma ashing, thereby producing a laminate for an evaluation test, in which a predetermined opening portion was formed in the metal hard mask.

Using the obtained laminate, plasma etching was carried out using the metal hard mask as a mask, and the SiN film and the $SiO_2$ film were etched until the surface of the Co film was exposed to form holes, thereby producing a sample 1 (See FIG. 1). When a cross section of this laminate was checked with a scanning electron microscope (SEM), plasma etching residues were observed on the wall surface in the holes.

Then, the residue removability was evaluated according to the following procedure. First, a prepared section (about 2.0 cm×2.0 cm) of the sample 1 was immersed in each treatment liquid of which the temperature was adjusted to 60° C. Immediately after 5 minutes had elapsed from the start of the immersion, the section of the sample 1 was taken out, immediately washed with ultrapure water, and dried with $N_2$. Then, the surface of the section of the immersed sample 1 was observed with SEM to check the presence or absence of the plasma etching residues. Similarly, each of the sections of the sample 1, which had been soaked for 8 minutes and 10 minutes, was washed with ultrapure water and dried with $N_2$, and then the surface of each section was observed with SEM to check the presence or absence of the plasma etching residues.

From the observation results of each section of the sample 1, the residue removability (the removability of the plasma etching residues) was evaluated according to the following determination standards.

(Evaluation Standards)

"A": The plasma etching residues were completely removed by immersion for 5 minutes.

"B": The plasma etching residues were not completely removed by immersion for 5 minutes but were completely removed by immersion for 8 minutes.

"C": The plasma etching residues were not completely removed by immersion for 8 minutes but were completely removed by immersion for 10 minutes.

"D": The plasma etching residues were not completely removed even after immersion for 10 minutes; however, there was no problem in performance.

"E": The plasma etching residues were not removed even by immersion for 10 minutes, which affected the performance.

[Defect Suppressibility]

The number of foreign matters having a diameter of 32 nm or more and the addresses of the respective foreign matters present on the surface of a silicon substrate having a diameter of 300 mm were measured with a wafer surface examination apparatus (SP-5, manufactured by KLA-Tencor Corporation).

Then, a wafer in which the number of foreign matters present on the surface of the silicon substrate was measured was set in a spin rotary wafer processing apparatus (manufactured by EKC technologies Inc.).

Next, each of the treatment liquids of Examples and Comparative Examples was discharged onto the surface of the set wafer at a flow rate of 1.5 L/min for 1 minute. Then, the wafer was subjected to spin drying.

Regarding the obtained dried wafer, the number of foreign matters and the addresses of the foreign matters on the wafer were measured using a wafer surface examination apparatus, and the foreign matters were observed and classified using a review SEM (SEMVision G7, manufactured by Applied Materials, Inc.), thereby measuring the number and the addresses of water marks in the measured foreign matters on the wafer.

The obtained number of water marks was evaluated according to the following evaluation standard. The results are shown in Table 1.

(Evaluation Standards)

"A": The number of water marks having a diameter of 32 nm or more is 0 or more and less than 100.

"B": The number of water marks having a diameter of 32 nm or more is 100 or more and less than 500.

"C": The number of water marks having a diameter of 32 nm or more is 500 or more and less than 1,000.

"D": The number of water marks having a diameter of 32 nm or more is 1,000 or more and less than 2,000.

"E": The number of water marks having a diameter of 32 nm or more is more than 2,000.

The following Table 1 shows the composition of the used treatment liquid and the evaluation results in each Example and each Comparative Example.

In the table, the "HG (%)" column indicates the content (unit: % by mass) of hexylene glycol contained in the treatment liquid.

The "Compound A" column indicates the kind and content of the compound A contained in the treatment liquid.

In the "Compound A" column, the "Kind" column in the "(1)" column indicates the compound having the highest content among the compounds A, the "Kind" column in the "(2)" column indicates the compound having the second highest content among the compounds A, and the "Kind" column in the "(3)" column indicates the compound having the third highest content among the compounds A.

In addition, in the "Compound A" column, the "α (ppm)" column, the "β (ppm)" column, and the "γ (ppm)" column respectively indicate the contents (unit: ppm by mass) of the corresponding compounds.

The "α/β" column indicates, in terms mass ratio, the ratio (α/β) of the content α of the compound having the highest content among the compounds A described in the "(1)" column relative to the content β of the compound having the second highest content among the compounds A described in the "(2)" column.

The "β/γ" column indicates, in terms mass ratio, the ratio (β/γ) of the content β of the compound having the second highest content among the compounds A described in the "(1)" column relative to the content γ of the compound having the third highest content among the compounds A described in the "(3)" column.

The "water (%)" column indicates the content (unit: % by mass) of water contained in the treatment liquid.

In the "Basic compound" column, the "Kind" column and the "Amount (%)" column respectively indicate the kind and the content (unit: % by mass) of the basic compound contained in the treatment liquid.

TABLE 1

| | Treatment liquid composition | | | | | | | | | | | | Treatment liquid | Evaluation | |
|---|---|---|---|---|---|---|---|---|---|---|---|---|---|---|---|
| | | Compound A | | | | | | | | | Basic compound | | | | |
| | | (1) | | (2) | | (3) | | | | | | | | | |
| | HG (%) | Kind | α (ppm) | Kind | β (ppm) | Kind | γ (ppm) | α/β | β/γ | Water (%) | Kind | Amount (%) | pH | Residue removal property | Defect suppressibility |
| Example 1 | 79.99 | A-1 | 100 | — | | — | | | | 10.0 | HA | 10.0 | 8.3 | C | B |
| Example 2 | 79.95 | A-1 | 500 | — | | — | | | | 10.0 | HA | 10.0 | 8.3 | B | C |
| Example 3 | 79.90 | A-1 | 1000 | — | | — | | | | 10.0 | HA | 10.0 | 8.3 | B | C |
| Example 4 | 79.80 | A-1 | 2000 | — | | — | | | | 10.0 | HA | 10.0 | 8.3 | B | D |
| Example 5 | 79.99 | A-2 | 100 | — | | — | | | | 10.0 | HA | 10.0 | 8.3 | D | B |
| Example 6 | 79.99 | A-3 | 100 | — | | — | | | | 10.0 | HA | 10.0 | 8.3 | C | B |
| Example 7 | 79.95 | A-3 | 500 | — | | — | | | | 10.0 | HA | 10.0 | 8.3 | B | C |
| Example 8 | 79.90 | A-3 | 1000 | — | | — | | | | 10.0 | HA | 10.0 | 8.3 | B | C |
| Example 9 | 79.80 | A-3 | 2000 | — | | — | | | | 10.0 | HA | 10.0 | 8.3 | B | D |
| Example 10 | 79.99 | A-4 | 100 | — | | — | | | | 10.0 | HA | 10.0 | 8.3 | C | B |

TABLE 1-continued

| | Treatment liquid composition | | | | | | | | | | | | Treat- | Evaluation | |
|---|---|---|---|---|---|---|---|---|---|---|---|---|---|---|---|
| | | Compound A | | | | | | | | | | | | | |
| | | (1) | | (2) | | (3) | | | | | Basic compound | | ment | Residue | Defect |
| | HG (%) | Kind | α (ppm) | Kind | β (ppm) | Kind | γ (ppm) | α/β | β/γ | Water (%) | Kind | Amount (%) | liquid pH | removal property | suppress-ibility |
| Example 11 | 79.95 | A-4 | 500 | — | | — | | | | 10.0 | HA | 10.0 | 8.3 | B | C |
| Example 12 | 79.90 | A-4 | 1000 | — | | — | | | | 10.0 | HA | 10.0 | 8.3 | B | C |
| Example 13 | 79.80 | A-4 | 2000 | — | | — | | | | 10.0 | HA | 10.0 | 8.3 | B | D |
| Example 14 | 79.90 | A-5 | 100 | — | | — | | | | 10.0 | HA | 10.0 | 8.3 | C | B |
| Example 15 | 79.95 | A-5 | 500 | — | | — | | | | 10.0 | HA | 10.0 | 8.3 | B | C |
| Example 16 | 79.90 | A-5 | 1000 | — | | — | | | | 10.0 | HA | 10.0 | 8.3 | B | C |
| Example 17 | 79.80 | A-5 | 2000 | — | | — | | | | 10.0 | HA | 10.0 | 8.3 | B | D |
| Example 18 | 79.95 | A-6 | 500 | — | | — | | | | 10.0 | HA | 10.0 | 8.3 | D | B |
| Example 19 | 79.90 | A-1 | 1000 | — | | — | | | | 10.0 | TMAH | 10.0 | 11.0 | B | B |
| Example 20 | 79.90 | A-3 | 1000 | — | | — | | | | 10.0 | TMAH | 10.0 | 11.0 | B | B |
| Example 21 | 79.90 | A-4 | 1000 | — | | — | | | | 10.0 | TMAH | 10.0 | 11.0 | B | B |
| Example 22 | 79.90 | A-5 | 1000 | — | | — | | | | 10.0 | TMAH | 10.0 | 11.0 | B | B |
| Example 23 | 79.90 | A-1 | 1000 | — | | — | | | | 10.0 | MEA | 10.0 | 10.5 | B | B |
| Example 24 | 79.90 | A-3 | 1000 | — | | — | | | | 10.0 | MEA | 10.0 | 10.5 | B | B |
| Example 25 | 79.90 | A-4 | 1000 | — | | — | | | | 10.0 | MEA | 10.0 | 10.5 | B | B |

TABLE 2

| | Treatment liquid composition | | | | | | | | | | | | | Evaluation | |
|---|---|---|---|---|---|---|---|---|---|---|---|---|---|---|---|
| | | Compound A | | | | | | | | | | | | | |
| | | (1) | | (2) | | (3) | | | | | Basic compound | | Treatment | Residue | |
| (Continued) | HG (%) | Kind | α (ppm) | Kind | β (ppm) | Kind | γ (ppm) | α/β | β/γ | Water (%) | Kind | Amount (%) | liquid pH | removal property | Defect suppressibility |
| Example 26 | 79.90 | A-5 | 1000 | — | | — | | | | 10.0 | MEA | 10.0 | 10.5 | B | B |
| Example 27 | 69.90 | A-1 | 1000 | — | | — | | | | 20.0 | HA | 10.0 | 8.3 | C | B |
| Example 28 | 69.90 | A-3 | 1000 | — | | — | | | | 20.0 | HA | 10.0 | 8.3 | C | B |
| Example 29 | 69.90 | A-4 | 1000 | — | | — | | | | 20.0 | HA | 10.0 | 8.3 | C | B |
| Example 30 | 69.90 | A-5 | 1000 | — | | — | | | | 20.0 | HA | 10.0 | 8.3 | C | B |
| Example 31 | 49.90 | A-1 | 1000 | — | | — | | | | 40.0 | HA | 10.0 | 8.3 | D | B |
| Example 32 | 49.90 | A-3 | 1000 | — | | — | | | | 40.0 | HA | 10.0 | 8.3 | D | B |
| Example 33 | 49.90 | A-4 | 1000 | — | | — | | | | 40.0 | HA | 10.0 | 8.3 | D | B |
| Example 34 | 49.90 | A-5 | 1000 | — | | — | | | | 40.0 | HA | 10.0 | 8.3 | D | B |
| Example 35 | 79.90 | A-5 | 1000 | A-3 | 200 | — | | 5.0 | | 10.0 | HA | 10.0 | 8.3 | A | B |
| Example 36 | 79.90 | A-5 | 1000 | A-3 | 110 | — | | 9.1 | | 10.0 | HA | 10.0 | 8.3 | A | B |
| Example 37 | 79.90 | A-5 | 1000 | A-3 | 90 | — | | 11.1 | | 10.0 | HA | 10.0 | 8.3 | A | C |
| Example 38 | 79.90 | A-5 | 1000 | A-3 | 50 | — | | 20.0 | | 10.0 | HA | 10.0 | 8.3 | A | C |
| Example 39 | 79.90 | A-3 | 1000 | A-5 | 200 | — | | 5.0 | | 10.0 | HA | 10.0 | 8.3 | A | B |
| Example 40 | 79.90 | A-3 | 1000 | A-5 | 50 | — | | 20.0 | | 10.0 | HA | 10.0 | 8.3 | A | C |
| Example 41 | 79.90 | A-5 | 1000 | A-1 | 200 | — | | 5.0 | | 10.0 | HA | 10.0 | 8.3 | A | B |
| Example 42 | 79.90 | A-5 | 1000 | A-1 | 50 | — | | 20.0 | | 10.0 | HA | 10.0 | 8.3 | A | C |
| Example 43 | 79.90 | A-1 | 1000 | A-5 | 200 | — | | 5.0 | | 10.0 | HA | 10.0 | 8.3 | A | B |
| Example 44 | 79.90 | A-1 | 1000 | A-5 | 50 | — | | 20.0 | | 10.0 | HA | 10.0 | 8.3 | A | C |
| Example 45 | 79.90 | A-3 | 1000 | A-1 | 200 | — | | 5.0 | | 10.0 | HA | 10.0 | 8.3 | A | B |
| Example 46 | 79.90 | A-3 | 1000 | A-1 | 50 | — | | 20.0 | | 10.0 | HA | 10.0 | 8.3 | A | C |
| Example 47 | 79.90 | A-1 | 1000 | A-3 | 200 | — | | 5.0 | | 10.0 | HA | 10.0 | 8.3 | A | B |
| Example 48 | 79.90 | A-1 | 1000 | A-3 | 50 | — | | 20.0 | | 10.0 | HA | 10.0 | 8.3 | A | C |
| Example 49 | 79.90 | A-5 | 1000 | A-4 | 200 | — | | 5.0 | | 10.0 | HA | 10.0 | 8.3 | A | B |
| Example 50 | 79.90 | A-5 | 1000 | A-4 | 50 | — | | 20.0 | | 10.0 | HA | 10.0 | 8.3 | A | C |

TABLE 3

| | Treatment liquid composition | | | | | | | | | | | | | Evaluation | |
|---|---|---|---|---|---|---|---|---|---|---|---|---|---|---|---|
| | | Compound A | | | | | | | | | | | | | |
| | | (1) | | (2) | | (3) | | | | | Basic compound | | Treatment | Residue | |
| (Continued) | HG (%) | Kind | α (ppm) | Kind | β (ppm) | Kind | γ (ppm) | α/β | β/γ | Water (%) | Kind | Amount (%) | liquid pH | removal property | Defect suppressibility |
| Example 51 | 79.90 | A-4 | 1000 | A-5 | 200 | — | | 5.0 | | 10.0 | HA | 10.0 | 8.3 | A | B |
| Example 52 | 79.90 | A-4 | 1000 | A-5 | 50 | — | | 20.0 | | 10.0 | HA | 10.0 | 8.3 | A | C |
| Example 53 | 79.90 | A-3 | 1000 | A-4 | 200 | — | | 5.0 | | 10.0 | HA | 10.0 | 8.3 | A | B |
| Example 54 | 79.90 | A-3 | 1000 | A-4 | 50 | — | | 20.0 | | 10.0 | HA | 10.0 | 8.3 | A | C |
| Example 55 | 79.90 | A-4 | 1000 | A-3 | 200 | — | | 5.0 | | 10.0 | HA | 10.0 | 8.3 | A | B |
| Example 56 | 79.90 | A-4 | 1000 | A-3 | 50 | — | | 20.0 | | 10.0 | HA | 10.0 | 8.3 | A | C |
| Example 57 | 79.90 | A-1 | 1000 | A-4 | 200 | — | | 5.0 | | 10.0 | HA | 10.0 | 8.3 | A | B |
| Example 58 | 79.90 | A-1 | 1000 | A-4 | 50 | — | | 20.0 | | 10.0 | HA | 10.0 | 8.3 | A | C |
| Example 59 | 79.90 | A-4 | 1000 | A-1 | 200 | — | | 5.0 | | 10.0 | HA | 10.0 | 8.3 | A | B |
| Example 60 | 79.90 | A-4 | 1000 | A-1 | 50 | — | | 20.0 | | 10.0 | HA | 10.0 | 8.3 | A | C |
| Example 61 | 79.90 | A-5 | 1000 | A-3 | 200 | A-1 | 50 | 5.0 | 4.0 | 10.0 | HA | 10.0 | 8.3 | A | A |
| Example 62 | 79.90 | A-5 | 1000 | A-3 | 200 | A-1 | 22 | 5.0 | 9.1 | 10.0 | HA | 10.0 | 8.3 | A | A |
| Example 63 | 79.90 | A-5 | 1000 | A-3 | 200 | A-1 | 18 | 5.0 | 11.1 | 10.0 | HA | 10.0 | 8.3 | A | B |
| Example 64 | 79.90 | A-5 | 1000 | A-3 | 200 | A-1 | 10 | 5.0 | 20.0 | 10.0 | HA | 10.0 | 8.3 | A | B |
| Example 65 | 79.90 | A-5 | 1000 | A-1 | 200 | A-3 | 50 | 5.0 | 4.0 | 10.0 | HA | 10.0 | 8.3 | A | A |
| Example 66 | 79.90 | A-5 | 1000 | A-1 | 200 | A-3 | 10 | 5.0 | 20.0 | 10.0 | HA | 10.0 | 8.3 | A | B |
| Example 67 | 79.90 | A-3 | 1000 | A-5 | 200 | A-1 | 50 | 5.0 | 4.0 | 10.0 | HA | 10.0 | 8.3 | A | A |
| Example 68 | 79.90 | A-3 | 1000 | A-5 | 200 | A-1 | 10 | 5.0 | 20.0 | 10.0 | HA | 10.0 | 8.3 | A | B |
| Example 69 | 79.90 | A-3 | 1000 | A-1 | 200 | A-5 | 50 | 5.0 | 4.0 | 10.0 | HA | 10.0 | 8.3 | A | A |
| Example 70 | 79.90 | A-3 | 1000 | A-1 | 200 | A-5 | 10 | 5.0 | 20.0 | 10.0 | HA | 10.0 | 8.3 | A | B |
| Example 71 | 79.90 | A-1 | 1000 | A-5 | 200 | A-3 | 50 | 5.0 | 4.0 | 10.0 | HA | 10.0 | 8.3 | A | A |
| Example 72 | 79.90 | A-1 | 1000 | A-5 | 200 | A-3 | 10 | 5.0 | 20.0 | 10.0 | HA | 10.0 | 8.3 | A | B |
| Example 73 | 79.90 | A-1 | 1000 | A-3 | 200 | A-5 | 50 | 5.0 | 4.0 | 10.0 | HA | 10.0 | 8.3 | A | A |
| Example 74 | 79.90 | A-1 | 1000 | A-3 | 200 | A-5 | 10 | 5.0 | 20.0 | 10.0 | HA | 10.0 | 8.3 | A | B |
| Comparative Example 1 | 99.00 | — | | — | | — | | | | 1.0 | — | | 6.5 | E | E |
| Comparative Example 2 | 89.00 | — | | — | | — | | | | 1.0 | HA | 10.0 | 8.3 | E | B |

From the results shown in Table 1, it has been confirmed that the present treatment liquid is excellent in residue removability as compared with the treatment liquids of Comparative Examples 1 and 2, which do contain the compound A.

It has been confirmed that in a case where the content of the hexylene glycol contained in the treatment liquid is 60% by mass or more, the residue removability is more excellent (the comparison among Examples 27 to 34), and it has been confirmed that in a case where the content of the hexylene glycol contained in the treatment liquid is 75% by mass or more, the residue removability is still more excellent (the comparison among Examples 3, 8, 12, 16, and 27 to 30).

It has been confirmed that in a case where the treatment liquid contains, as the compound A, at least one kind selected from the group consisting of isobutene (A-1), 4-methyl-1,3-pentadiene (A-3), 2,2,4-trimethyloxetane (A-4), and 4-methyl-3-penten-2-ol (A-5), the residue removability is more excellent (the comparison among Examples 1 to 18).

It has been confirmed that in a case where the content of the compound A contained in the treatment liquid is 400 ppm by mass or more, the residue removability is more excellent (the comparison among Examples 1 and 2, and the like).

In addition, it has been confirmed that in a case where the content of the compound A contained in the treatment liquid is 1,000 ppm by mass or less, the defect suppressibility is more excellent (the comparison among Examples 3 and 4, and the like).

It has been confirmed that in a case where the treatment liquid contains two or more kinds of the compounds A, the residue removability is more excellent (the comparison among Examples 1 to 18 and 35 to 74).

It has been confirmed that in a case where the ratio α/β is less than 10, the defect suppressibility is more excellent (the comparison among Examples 36 and 37, and the like).

In addition, it has been confirmed that in a case where the ratio β/γ is less than 10, the defect suppressibility is more excellent (the comparison among Examples 62 and 63, and the like).

Examples 101 to 114

[Preparation of Treatment Liquid]

Each component shown in Table 2 was prepared and mixed according to the formulation shown in Table 2 to prepare a treatment liquid of each Example. It is noted that in each treatment liquid, the content of each component (all in terms of mass) is as described in the table.

It is noted that in Examples 101 to 114, the following components were used in addition to the components used in Examples 1 to 74.

(Basic Compound)

B-1: 2-(2-aminoethylamino)ethanol (corresponding to the compound B represented by Formula (2))

B-2: 2,2'-oxybis(ethylamine) (corresponding to the compound B represented by Formula (2))

B-3: Ethylenediamine (corresponding to an amine compound)

The prepared treatment liquids of Examples 101 to 114 were diluted 10 times by volume with ultrapure water. As a result of measuring the pH's of the diluted treatment liquids at 25° C. using a pH meter, the pH's all were in a range of 8.0 to 12.0.

[Measurement and Evaluation]

According to the above-described method, the contents of the compound A and the basic compound contained in each of the treatment liquids of Examples 101 to 114 were measured, and the residue removability (the removability of plasma etching residues) and the defect suppressibility were evaluated.

Table 2 shows the compositions of the used treatment liquids used and the evaluation results in Examples 101 to 114.

In Table 2, the "Ratio 1" column indicates, in terms of mass ratio, the ratio of the content of the compound having the highest content among the amine compounds contained in the treatment liquid relative to the content of the compound having the lowest content among the amine compounds contained in the treatment liquid.

TABLE 4

| | Treatment liquid composition | | | | | | | | | | Evaluation | |
|---|---|---|---|---|---|---|---|---|---|---|---|---|
| | | Compound A | | | Basic compound | | | | | Treatment | Residue | |
| | HG (%) | Kind | α (ppm) | Water (%) | Kind | Amount (%) | Kind | Amount (%) | Ratio 1 | liquid pH | removal property | Defect suppressibility |
| Example 101 | 15.00 | A-5 | 500 | 74.45 | HA | 10.0 | B-1 | 0.50 | 20.0 | 10.3 | D | A |
| Example 102 | 10.00 | A-5 | 1000 | 49.60 | HA | 10.0 | B-2 | 0.30 | 33.3 | 10.0 | D | A |
| Example 103 | 80.00 | A-5 | 1000 | 9.30 | HA | 10.0 | B-1 | 0.60 | 16.7 | 10.4 | B | A |
| Example 104 | 40.00 | A-5 | 1000 | 49.80 | HA | 10.0 | B-2 | 0.10 | 100.0 | 9.6 | D | A |
| Example 105 | 5.00 | A-5 | 100 | 84.29 | HA | 10.0 | B-1 | 0.70 | 14.3 | 11.0 | D | A |
| Example 106 | 70.00 | A-5 | 100 | 19.49 | HA | 10.0 | B-1 | 0.50 | 20.0 | 10.3 | C | A |
| Example 107 | 70.00 | A-5 | 100 | 19.49 | HA | 10.0 | B-3 | 0.50 | 20.0 | 10.6 | C | B |
| Example 108 | 15.00 | A-5 | 500 | 74.95 | HA | 10.0 | — | — | — | 9.2 | D | C |
| Example 109 | 8.00 | A-5 | 100 | 80.89 | HA | 10.0 | B-2 | 1.10 | 9.1 | 11.5 | D | A |
| Example 110 | 15.00 | A-5 | 500 | 74.70 | HA | 10.0 | B-1 | 0.25 | 40.0 | 10.3 | D | A |
| Example 111 | 15.00 | A-5 | 500 | 74.85 | HA | 10.0 | B-1 | 0.10 | 100.0 | 10.3 | D | A |
| Example 112 | 15.00 | A-5 | 500 | 73.95 | HA | 10.0 | B-1 | 1.00 | 10.0 | 10.3 | D | A |
| Example 113 | 15.00 | A-5 | 500 | 74.75 | HA | 9.00 | B-1 | 1.20 | 7.5 | 10.3 | D | B |
| Example 114 | 15.00 | A-5 | 500 | 78.90 | HA | 6.00 | B-1 | 0.05 | 120.0 | 10.3 | D | B |

From the results shown in Table 2, it has been confirmed that similar to the treatment liquids of Examples 1 to 74, the treatment liquids of Examples 101 to 114 have excellent residue removability as compared with the treatment liquids of Comparative Examples 1 and 2, which does not contain the compound A.

It has been confirmed that in a case where the treatment liquid contains two or more kinds of amine compounds, the defect suppressibility is more excellent (the comparison among Examples 105 to 109).

In addition, it has been confirmed that in a case where the treatment liquid contains two or more kinds of amine compounds and at least one kind of the compound B, the defect suppressibility is still more excellent (the comparison among Examples 105 to 107 and 109).

In addition, it has been confirmed that in a case where the content of the compound B is 0.1% to 1.15% by mass with respect to the total mass of the treatment liquid, the defect suppressibility is particularly excellent (the comparison among Examples 101 and 110 to 114).

Further, it has been confirmed that in a case where the ratio 1 is 9 to 100, the defect suppressibility is particularly excellent (the comparison among Examples 101 and 110 to 114).

EXPLANATION OF REFERENCES

1: substrate
2: metal layer

3: etching stop layer
4: interlayer insulating film
5: metal hard mask
6: hole
10: laminate
11: inner wall
11*a*: cross-sectional wall
11*b*: bottom wall
12: dry etching residue

What is claimed is:

1. A treatment liquid for a semiconductor device, comprising:
water;
a basic compound;
hexylene glycol; and
a compound A that is at least one kind selected from the group consisting of isobutene, (E)-2-methyl-1,3-pentadiene, 4-methyl-1,3-pentadiene, 2,2,4-trimethyloxetane, 4-methyl-3-penten-2-ol, and 2,4,4,6-tetramethyl-1,3-dioxane.

2. The treatment liquid according to claim 1,
wherein in a case where the treatment liquid comprises one kind of the compound A, a content of the compound A with respect to a total mass of the treatment liquid is 1,000 ppm by mass or less, and
in a case where the treatment liquid comprises two or more kinds of the compounds A, a content of each of the compounds A with respect to the total mass of the treatment liquid is 1,000 ppm by mass or less.

3. The treatment liquid according to claim 1,
wherein the treatment liquid comprises two or more kinds of the compounds A, and
in the treatment liquid, in a case where a content of a compound having a highest content among the compounds A is denoted by α and a content of a compound having a second highest content among the compounds A is denoted by β, a ratio α/β of the content α to the content β is less than 10 in terms of mass ratio.

4. The treatment liquid according to claim 1,
wherein the treatment liquid comprises three or more kinds of the compounds A, and
in the treatment liquid, in a case where a content of a compound having a second highest content among the compounds A is denoted by β and a content of a compound having a third highest content among the compounds A is denoted by γ, a ratio β/γ of the content β to the content γ is less than 10 in terms of mass ratio.

5. The treatment liquid according to claim 1, wherein the treatment liquid comprises at least one kind selected from the group consisting of isobutene, 4-methyl-1,3-pentadiene, 2,2,4-trimethyloxetane, and 4-methyl-3-penten-2-ol.

6. The treatment liquid according to claim 1, wherein a content of the hexylene glycol in the treatment liquid is 60% by mass or more with respect to a total mass of the treatment liquid.

7. The treatment liquid according to claim 1, wherein the basic compound comprises at least one selected from the group consisting of tetramethylammonium hydroxide, monoethanolamine, and hydroxylamine.

8. The treatment liquid according to claim 1, wherein the basic compound comprises a compound B represented by Formula (1), $$NH_2—CH_2CH_2—X—CH_2CH_2—Y \quad (1)$$

in Formula (1), X represents —NR— or —O—, R represents a hydrogen atom or a substituent, and Y represents a hydroxy group or a primary amino group.

9. The treatment liquid according to claim 8, wherein the compound B comprises at least one selected from the group consisting of 2-(2-aminoethylamino) ethanol, 2,2'-oxybis(ethylamine), and 2-(2-aminoethoxy)ethanol.

10. The treatment liquid according to claim 8, wherein a content of the compound B with respect to a total mass of the treatment liquid is 0.1% to 1.15% by mass.

11. The treatment liquid according to claim 1, wherein the basic compound comprises two or more kinds of amine compounds.

12. The treatment liquid according to claim 11, wherein in the treatment liquid, a ratio of a content of a compound having a highest content among the amine compounds to a content of an amine compound having a lowest content among the amine compounds is 9 to 100 in terms of mass ratio.

13. The treatment liquid according to claim 1, wherein the treatment liquid is used as a washing solution for removing etching residues from a substrate including a metal-containing layer or as a washing solution for removing residues from a substrate after chemical mechanical polishing.

14. A substrate washing method comprising a washing step of washing a substrate comprises a metal-containing layer, by contacting the substrate with the treatment liquid according to claim 1.

15. The treatment liquid according to claim 2, wherein the treatment liquid comprises two or more kinds of the compounds A, and in the treatment liquid, in a case where a content of a compound having a highest content among the compounds A is denoted by α and a content of a compound having a second highest content among the compounds A is denoted by β, a ratio α/β of the content α to the content β is less than 10 in terms of mass ratio.

16. The treatment liquid according to claim 2, wherein the treatment liquid comprises three or more kinds of the compounds A, and in the treatment liquid, in a case where a content of a compound having a second highest content among the compounds A is denoted by β and a content of a compound having a third highest content among the compounds A is denoted by γ, a ratio β/γ of the content β to the content γ is less than 10 in terms of mass ratio.

17. The treatment liquid according to claim 2, wherein the treatment liquid comprises at least one kind selected from the group consisting of isobutene, 4-methyl-1,3-pentadiene, 2,2,4-trimethyloxetane, and 4-methyl-3-penten-2-ol.

18. The treatment liquid according to claim 2, wherein a content of the hexylene glycol in the treatment liquid is 60% by mass or more with respect to a total mass of the treatment liquid.

19. The treatment liquid according to claim 2, wherein the basic compound comprises at least one selected from the group consisting of tetramethylammonium hydroxide, monoethanolamine, and hydroxylamine.

20. The treatment liquid according to claim 2, wherein the basic compound comprises a compound B represented by Formula (1), $$NH_2—CH_2CH_2—X—CH_2CH_2—Y \quad (1)$$

in Formula (1), X represents —NR— or —O—, R represents a hydrogen atom or a substituent, and Y represents a hydroxy group or a primary amino group.

* * * * *